United States Patent
Morishita et al.

(10) Patent No.: US 8,570,100 B2
(45) Date of Patent: Oct. 29, 2013

(54) DIRECT SAMPLING CIRCUIT AND RECEIVER

(75) Inventors: Yohei Morishita, Tokyo (JP); Noriaki Saito, Tokyo (JP)

(73) Assignee: Panasonic Corporation, Osaka (JP)

( * ) Notice: Subject to any disclaimer, the term of this patent is extended or adjusted under 35 U.S.C. 154(b) by 155 days.

(21) Appl. No.: 13/122,475

(22) PCT Filed: Aug. 30, 2010

(86) PCT No.: PCT/JP2010/005325
§ 371 (c)(1),
(2), (4) Date: Apr. 4, 2011

(87) PCT Pub. No.: WO2011/024481
PCT Pub. Date: Mar. 3, 2011

(65) Prior Publication Data
US 2011/0199122 A1 Aug. 18, 2011

(30) Foreign Application Priority Data
Aug. 31, 2009 (JP) .................................. 2009-200816

(51) Int. Cl.
*H04B 1/10* (2006.01)
*H04B 1/28* (2006.01)

(52) U.S. Cl.
USPC ............. 327/554; 327/94; 327/355; 455/313; 455/319; 455/333

(58) Field of Classification Search
USPC ................... 327/94, 337, 355, 356, 551–559; 375/316, 324, 329, 331; 455/130, 313, 455/318, 319, 323, 333
See application file for complete search history.

(56) References Cited

U.S. PATENT DOCUMENTS

| | | | |
|---|---|---|---|
| 6,856,925 B2 * | 2/2005 | Muhammad et al. | 702/75 |
| 7,057,540 B2 * | 6/2006 | Muhammad et al. | 341/143 |
| 7,539,721 B2 * | 5/2009 | Belveze et al. | 708/819 |
| 7,623,838 B2 * | 11/2009 | Staszewski et al. | 455/319 |
| 7,671,658 B2 * | 3/2010 | Harada et al. | 327/355 |

(Continued)

FOREIGN PATENT DOCUMENTS

| | | |
|---|---|---|
| JP | 2006-211153 | 8/2006 |
| JP | 2008-11493 | 1/2008 |
| WO | 2007/142341 | 12/2007 |
| WO | 2008/108090 | 9/2008 |

OTHER PUBLICATIONS

Shiozaki et al., "Design and measurement of harmonic rejection Direct Sampling Mixer," Microwave Conference, 2009. APMC 2009. Asia Pacific , pp. 293-296, Dec. 7-10, 2009.*

(Continued)

*Primary Examiner* — Patrick O'Neill
(74) *Attorney, Agent, or Firm* — Greenblum & Bernstein, P.L.C.

(57) ABSTRACT

A sampling circuit and a receiver, with relatively simple configurations, and clocks, exhibiting excellent frequency characteristics, are provided. In discrete time circuits, a charging switch is controlled on and off using one of four-phase control signals. A rotate capacitor shares electrical charge accumulated in an IQ generating circuit via the charging switch. A dump switch is controlled on and off using a different signal from the control signal used to control the charging switch on and off, among the four-phase control signals. A buffer capacitor shares electrical charge with the rotate capacitor via the dump switch to form an output value.

14 Claims, 34 Drawing Sheets

(56) References Cited

U.S. PATENT DOCUMENTS

| | | | |
|---|---|---|---|
| 7,907,004 B2* | 3/2011 | Yoshizawa et al. | 327/554 |
| 7,965,135 B2* | 6/2011 | Yoshizawa et al. | 327/554 |
| 7,973,586 B2* | 7/2011 | Hosokawa et al. | 327/355 |
| 8,164,380 B2* | 4/2012 | Hosokawa et al. | 327/554 |
| 8,340,617 B2* | 12/2012 | Hosokawa et al. | 455/313 |
| 8,385,874 B2* | 2/2013 | Abe et al. | 455/323 |
| 8,412,131 B2* | 4/2013 | Huang | 455/107 |
| 8,433,276 B2* | 4/2013 | Morishita | 455/323 |
| 2003/0035499 A1 | 2/2003 | Staszewski et al. | |
| 2005/0233725 A1 | 10/2005 | Muhammad et al. | |
| 2009/0009155 A1 | 1/2009 | Hosokawa et al. | |
| 2011/0170640 A1* | 7/2011 | Morishita | 375/340 |
| 2011/0176640 A1* | 7/2011 | Morishita et al. | 375/318 |
| 2011/0183639 A1* | 7/2011 | Morishita | 455/269 |

OTHER PUBLICATIONS

Morishita et al., "A low-IF direct sampling mixer with complex transfer function for ISDB-T one segment applications," Microwave Conference Proceedings (APMC), 2010 Asia-Pacific, pp. 698-701, Dec. 7-10, 2010.*

Robert Bogdan Staszewski et al., "All-Digital Tx Frequency Synthesizer and Discrete-Time Receiver for Bluetooth Radio in 130-nm CMOS", IEEE Journal of Solid-State Circuits, vol. 39, No. 12, Dec. 2004, pp. 2278-2291.

Yohei Morishita et al., "Fukusogata Direct Sampling Mixer no Sekkei", ("Design of the Complex Type of Direct Sampling Mixer"), The Institute of Electronics, Information and Communication Engineers, Sep. 1, 2009, p. 43.

U.S. Appl. No. 13/119,516 to Yohei Morishita, filed Mar. 17, 2011.
U.S. Appl. No. 13/120,945 to Yohei Morishita, filed Mar. 25, 2011.
U.S. Appl. No. 13/121,244 to Yohei Morishita et al., filed Mar. 28, 2011.
International Search Report for corresponding International Application No. PCT/JP2010/005325, mailed Nov. 22, 2010.

* cited by examiner

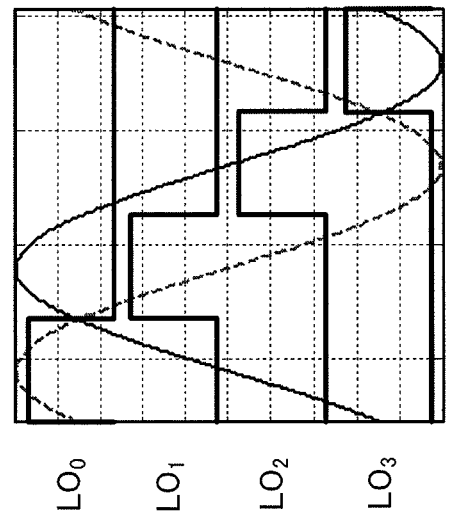
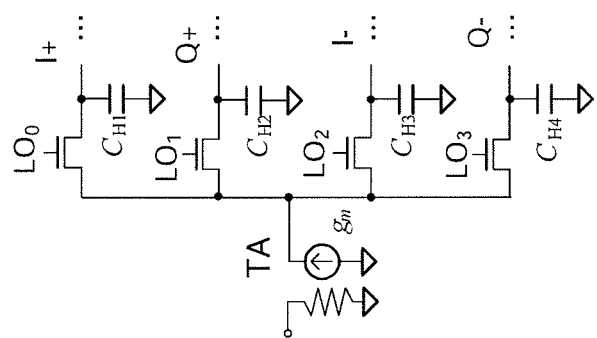
FIG. 13A

US 8,570,100 B2

DIRECT SAMPLING CIRCUIT AND RECEIVER

TECHNICAL FIELD

The present invention relates to a sampling circuit and a receiver, and, more particularly, to a sampling circuit and a receiver that perform received signal processing such as frequency conversion, filter processing and so forth by means of discrete time analog processing.

BACKGROUND ART

A configuration has been known that performs reception processing by means of direct discrete time sampling of a high-frequency signal with the aim of achieving small size and low power consumption of a receiver and integrating the analog signal processing section and digital signal processing section (see, for example, Patent Literature 1 and Non-Patent Literature 1).

FIG. 1 shows the overall configuration of a sampling circuit disclosed in Patent Literature 1. FIG. 2 is a timing chart showing control signals inputted to the circuit shown in FIG. 1. The sampling circuit shown in FIG. 1 performs frequency conversion on a received analog RF signal using a multi-tap direct sampling mixer to obtain a discrete time analog signal. To be more specific, electrical charge transfer between a plurality of capacitors included in the sampling circuit in FIG. 1 realizes filter characteristics resulting in the product of an FIR (finite impulse response) filer and an IIR (infinite impulse response) filter. Characteristics around the passband are determined based on second-order IIR filter characteristics. FIG. 3B shows an example of wideband frequency characteristics (local (LO) frequency $f_{LO}$=800 MHz). Here, FIG. 3A shows the narrowband frequency characteristic around the passband (800 MHz), in the frequency characteristic shown in FIG. 3B.

Moreover, a configuration in which image rejection can be performed, has been known as a technology based on the above-described configuration (see Patent Literature 2). FIG. 4 shows the whole configuration of a sampling circuit disclosed in Patent Literature 2. FIG. 5 shows an example of frequency characteristics obtained in the circuit shown in FIG. 4 (local (LO) frequency $f_{LO}$=800 MHz). As shown in FIG. 4, the frequency characteristics are bilaterally asymmetric with respect to the LO frequency and allow image rejection.

Moreover, as a discrete time direct sampling mixer that can realize high-order IIR characteristics, a configuration has been known in which basic multitap direct sampling mixers are arranged in parallel (for example, see Patent Literature 3). FIG. 6 shows a configuration of a discrete time direct sampling mixer disclosed in Patent Literature 3. In addition, FIG. 7 shows clocks supplied to the circuit shown in FIG. 6. FIG. 8A and FIG. 8B show examples of frequency characteristics obtained in the circuit shown in FIG. 6 (local (LO) frequency $f_{LO}$=800 MHz). By supplying clocks as shown in FIG. 7 to the circuit shown in FIG. 6 having appropriate circuit element values, it is possible to set attenuation poles in the bilateral symmetric positions with respect to the LO frequency as shown in FIG. 8A and FIG. 8B.

CITATION LIST

Patent Literature

PTL 1
U.S. Patent Application Publication No. 2003/0035499
PTL 2
U.S. Patent Application Publication No. 2005/0233725
PTL 3
Japanese Patent Application Laid-Open No. 2008-011493

Non-Patent Literature

NPL 1
IEEE Journal of Solid-State Circuits, Vol. 39, No. 12, December 2004, "All-Digital Tx Frequency Synthesizer and Discrete-time Receiver for Blue tooth Radio in 130-nm CMOS"

SUMMARY OF INVENTION

Technical Problem

However, the above-described prior art has the following problems.

In a conventional sampling circuit as shown in FIG. 1, the gain is maximized when the LO frequency and the RF input frequency match. Therefore, it is difficult to realize complete bilateral symmetric frequency characteristics with respect to the LO frequency, and consequently the above-described sampling circuit is not suitable for image rejection.

In addition, a sampling circuit having the configuration shown in FIG. 4 can realize the bilateral asymmetric frequency characteristic with respect to the LO frequency to perform image rejection. However, parameters that can change frequency characteristics are defined by the capacitance ratio between history capacitor $C_H$ and rotate capacitor $C_R$. The position in which the gain is maximized, and the cutoff frequency are determined by these two kinds of parameters and cannot be set individually, so that it is difficult to provide a satisfactory image rejection ratio.

In addition, with both configurations shown in FIG. 1 and FIG. 4, it is not possible to provide wideband characteristics as filter characteristics around the passband because the transfer functions are represented by second-order IIR characteristics.

Moreover, with the configuration shown in FIG. 6, although it is possible to realize high-order IIR characteristics, the denominator polynomial can have only real roots, so that feasible frequency characteristics are limited. Therefore, it is difficult to provide bilateral asymmetric characteristics, for example, with respect to the LO frequency. In addition, it is not possible to set poles, so that it is not possible to provide characteristics having low in-band deviation over a wideband.

Moreover, with the above-described conventional technique, the operating frequency of a discrete time circuit is reduced by connecting a plurality of prepared rotate capacitors to a buffer capacitor in turn. In this case, however, a plurality of rotate capacitors $C_R$ are connected to a buffer capacitor $C_B$ in turn. Therefore, if rotate capacitors $C_R$ vary, spurious of a clock supplied to a switch for switching connection of each rotate capacitor $C_R$ occurs in an output. FIG. 9 shows the principle of occurrence of unnecessary spurious. If there is the above-described unnecessary spurious, measures are required, for example, that a filter for removing spurious is separately provided, so that it is not possible to reduce cost and space. Moreover, with the above-described conventional technique, it is necessary to provide a number of clocks which are high at different timings and have high level periods shifted from each other.

It is therefore an object of the present invention to provide a sampling circuit and a receiver having excellent frequency characteristics with a relatively simple configuration and clocks.

Solution to Problem

The sampling circuit according to the present invention adopts a configuration to include: a clock generating circuit that outputs four-phase control signals according with a period of a carrier frequency of an input signal; an IQ generating circuit that samples the input signal according to the four-phase control signals, and accumulates four kinds of sample values having different phases as electrical charge; and a group of discrete time circuits including a first to a fourth discrete time circuits that share electrical charge of the four kinds of sample values with each other, wherein: each of the first to the fourth discrete time circuits includes: a charging switch; a rotate capacitor connected to the IQ generating circuit via the charging switch; a dump switch; and a buffer capacitor connected to the rotate capacitor via the dump switch; the charging switch is controlled on and off using any one of the four-phase control signals; the rotate capacitor shares electrical charge accumulated in the IQ generating circuit via the charging switch; the dump switch is controlled on and off using a signal having a different phase from a phase of a control signal to control the charging switch on and off, among the four-phase control signals; and the buffer capacitor forms an output value by sharing electrical charge with the rotate capacitor via the dump switch.

Advantageous Effects of Invention

According to the present invention, it is possible to provide excellent frequency characteristics with relatively simple configuration and clocks.

BRIEF DESCRIPTION OF DRAWINGS

FIG. 13A includes a connection diagram showing an IQ generating circuit according to Embodiment 1 and a timing chart showing control signals;

DESCRIPTION OF EMBODIMENTS

Now, embodiments of the present invention will be described in detail with reference to the accompanying drawings.

Embodiment 1

Figure 1:
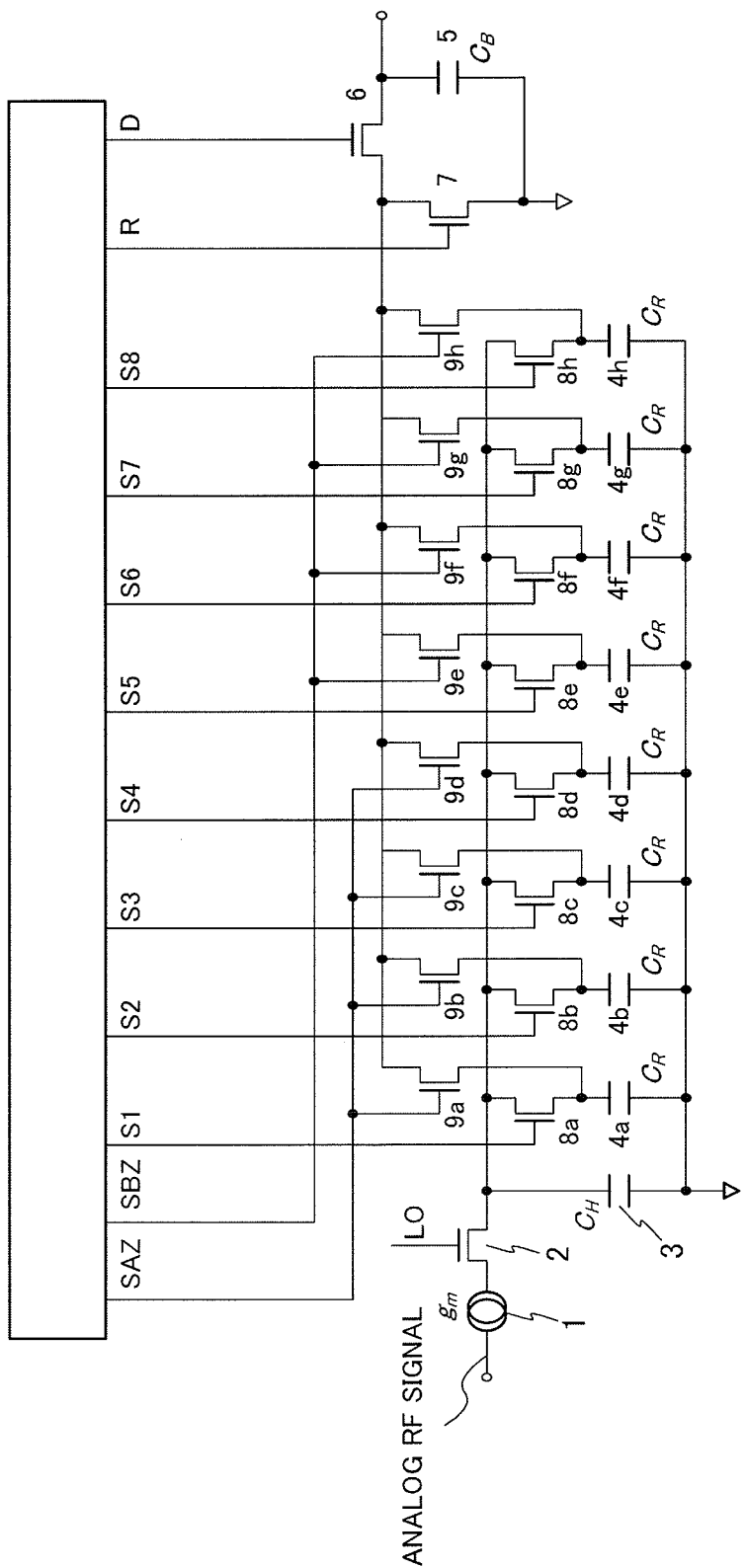
FIG. 1 shows an example of a configuration of a conventional sampling circuit.
Figure 2:
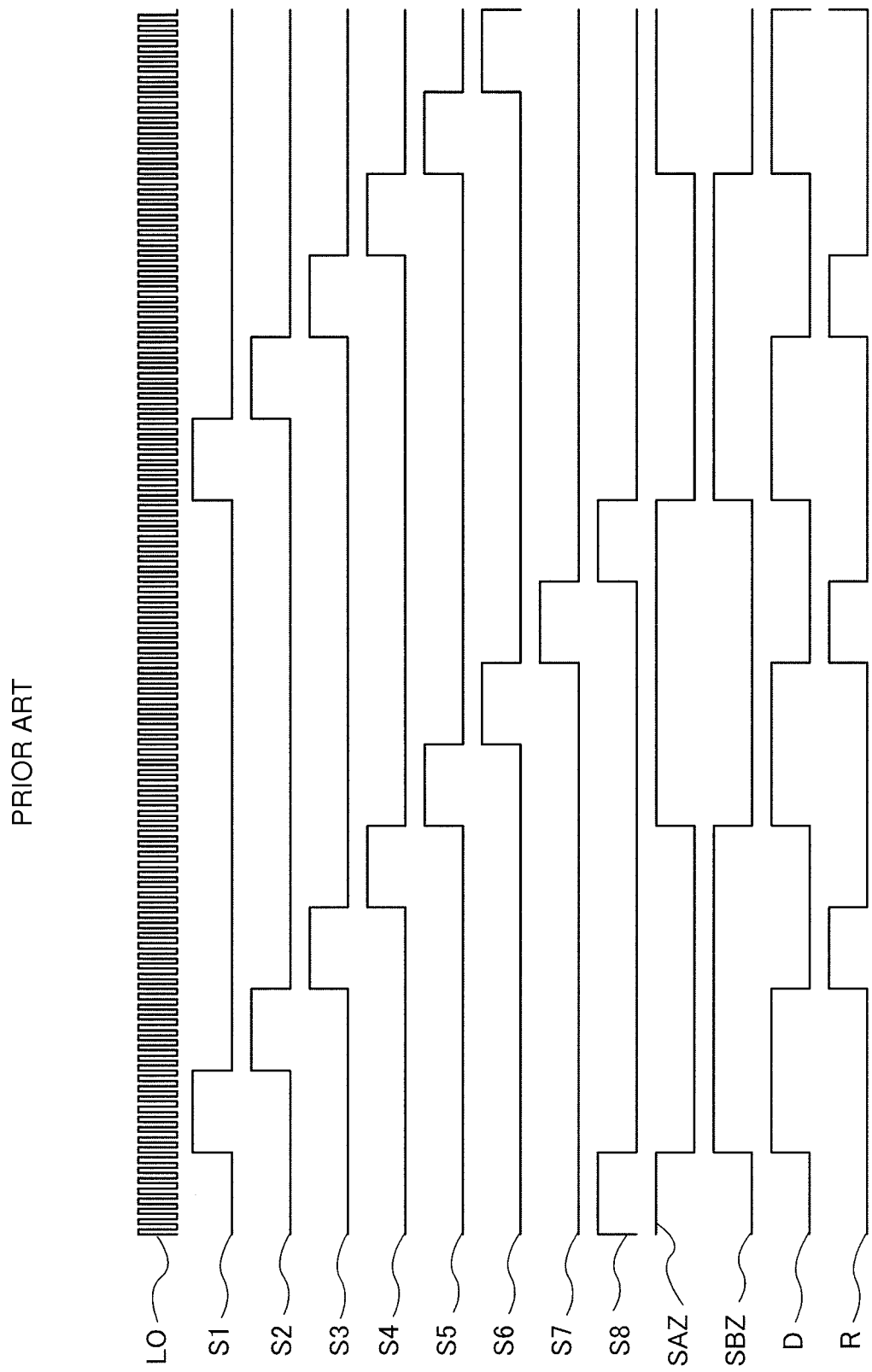
FIG. 2 is a timing chart showing control signals inputted to the conventional sampling circuit.
Figure 3B:
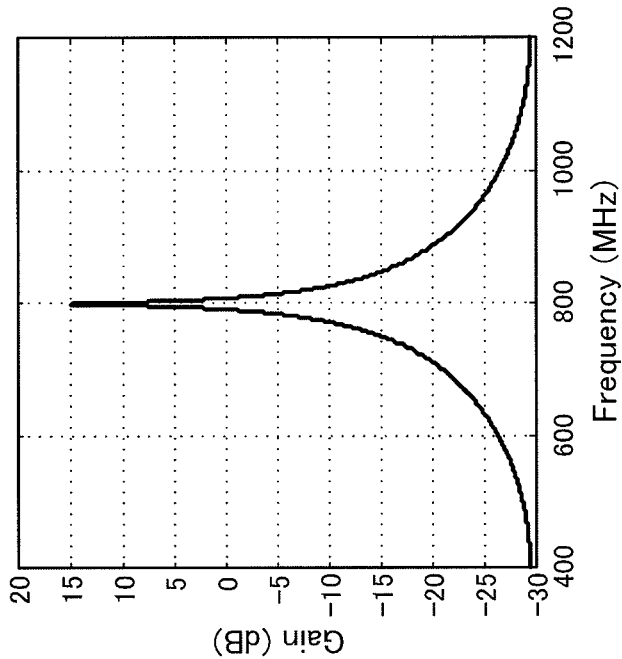
FIG. 3 is a characteristic diagram showing examples of filter characteristics realized in the conventional sampling circuit.
Figure 3A:
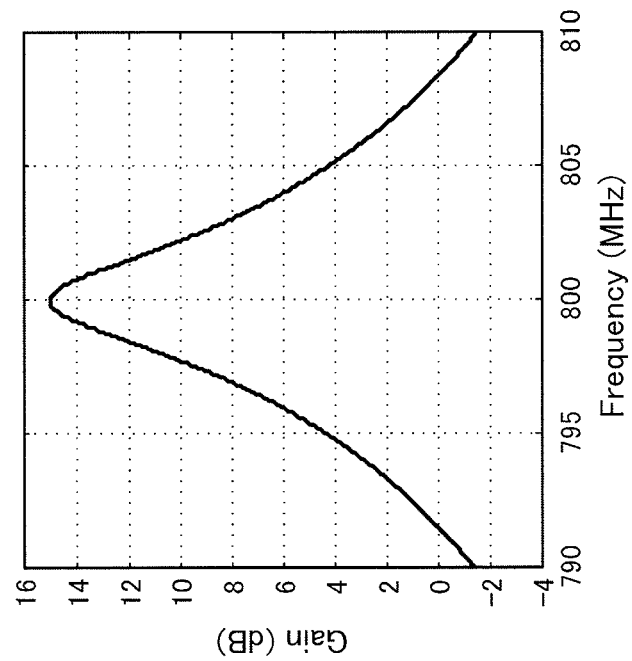
Figure 4:
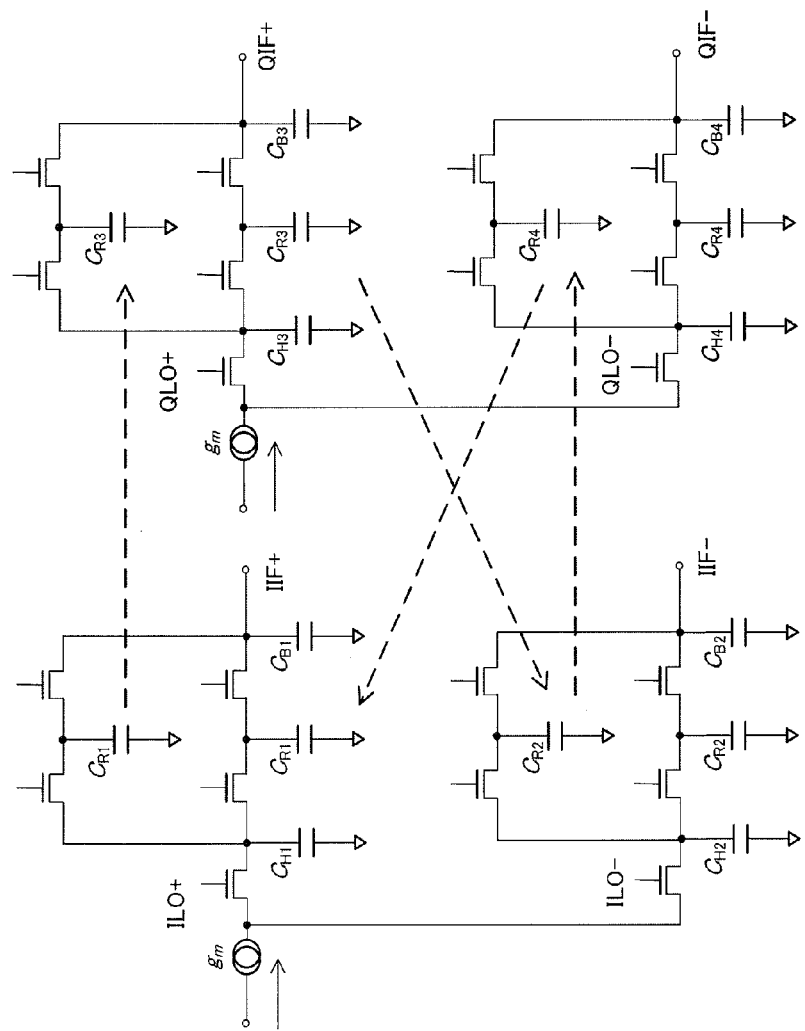
FIG. 4 shows an example of a configuration of the conventional sampling circuit.
Figure 5:
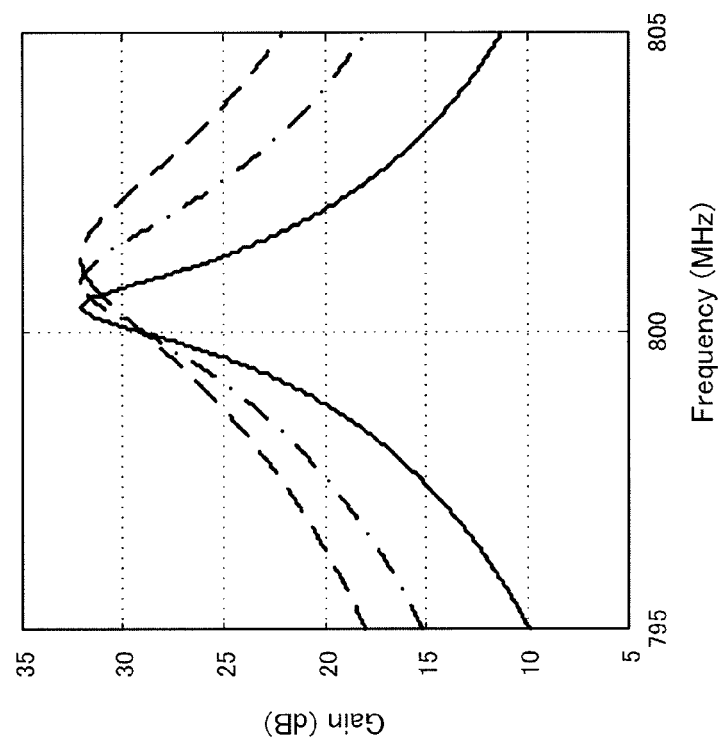
FIG. 5 is a characteristic diagram showing an example of filter characteristics realized in the conventional sampling circuit.
Figure 6:
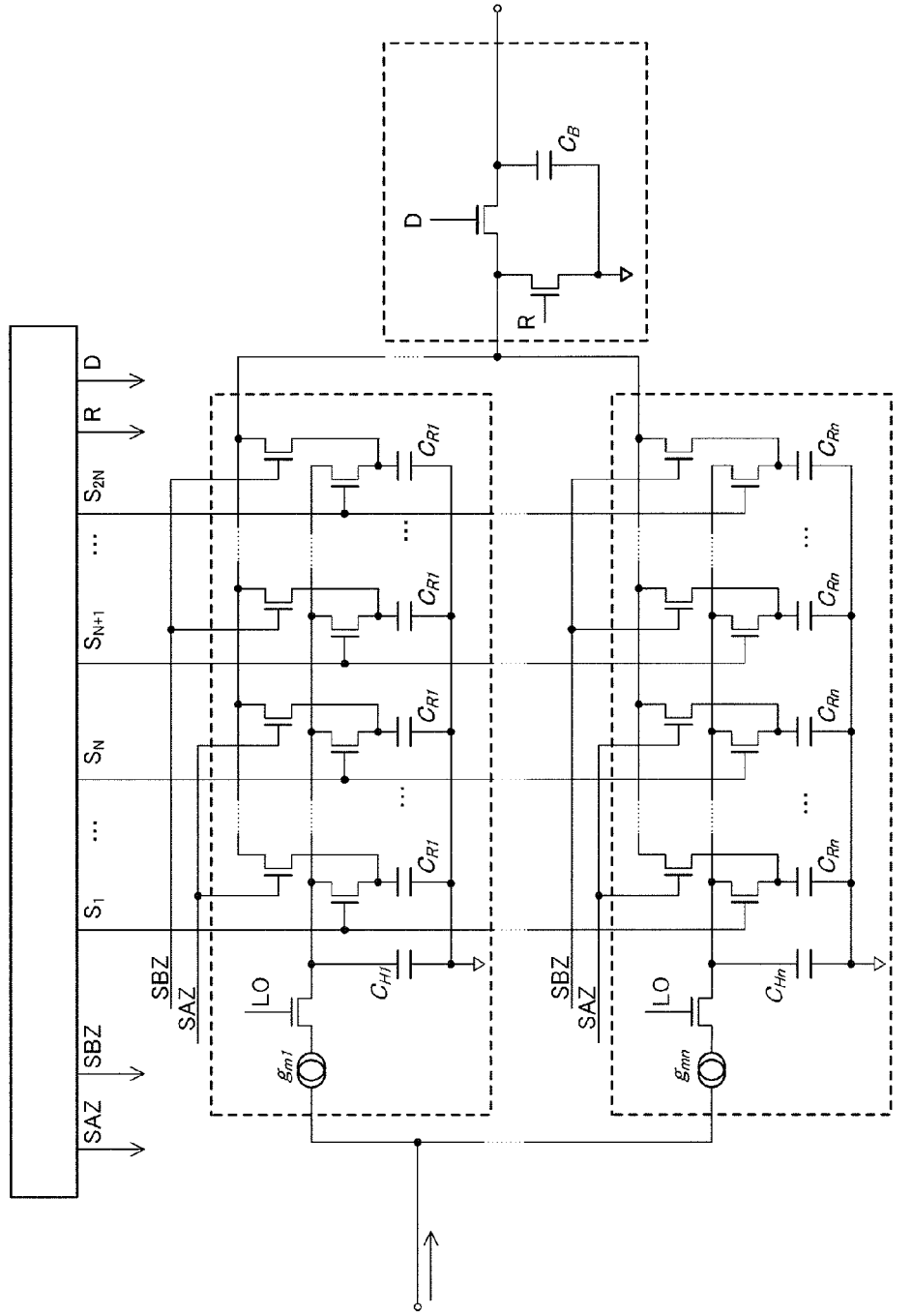
FIG. 6 shows an example of a configuration of the conventional sampling circuit.
Figure 7:
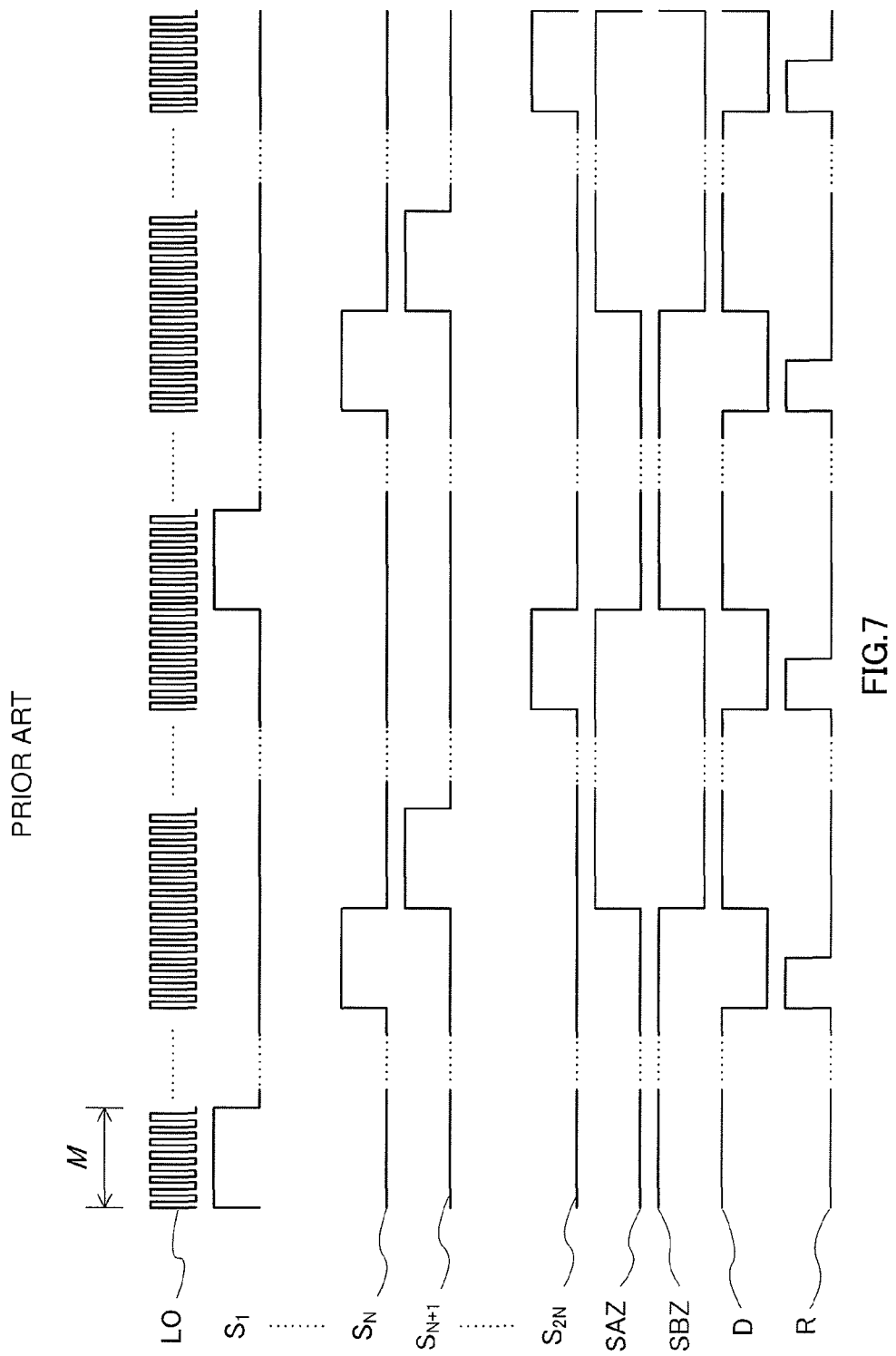
FIG. 7 is a timing chart showing control signals inputted to the conventional sampling circuit.
Figure 8:
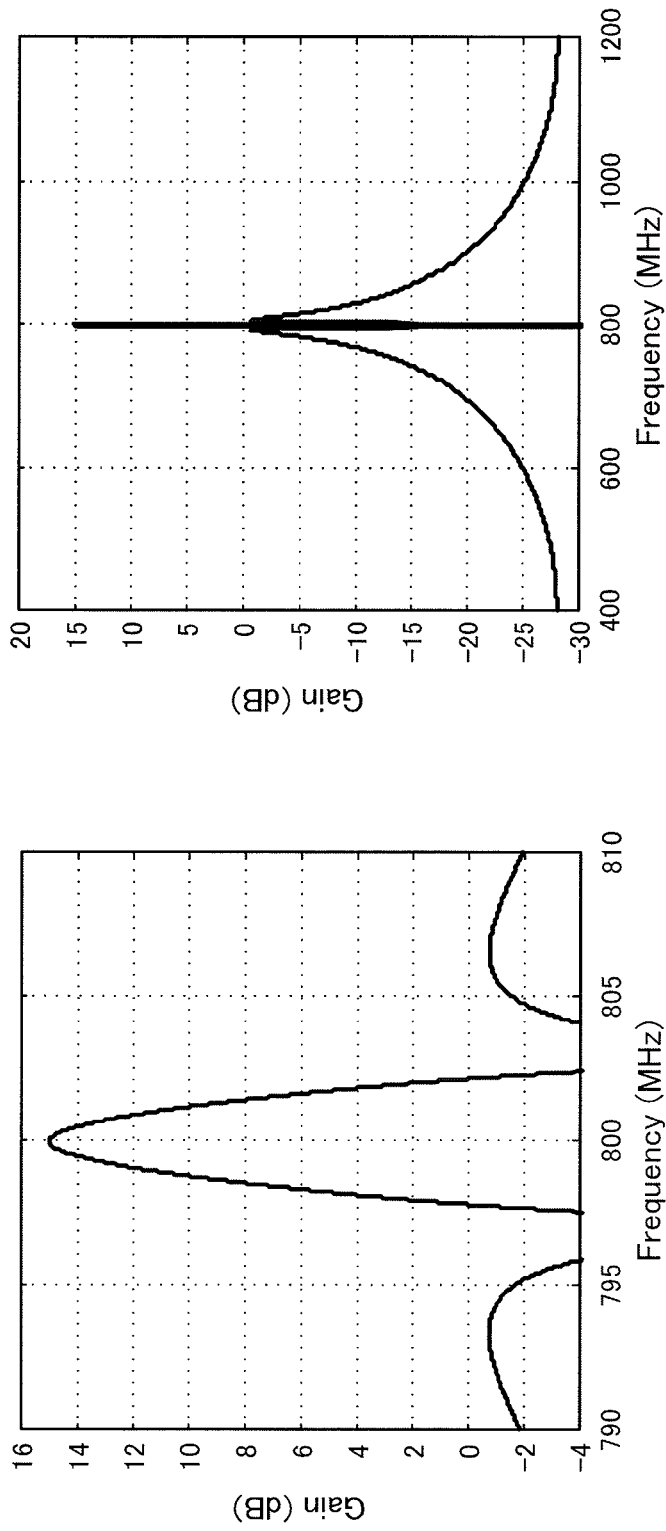
FIG. 8 is a characteristic diagram showing an example of filter characteristics realized in the conventional sampling circuit.
Figure 9:
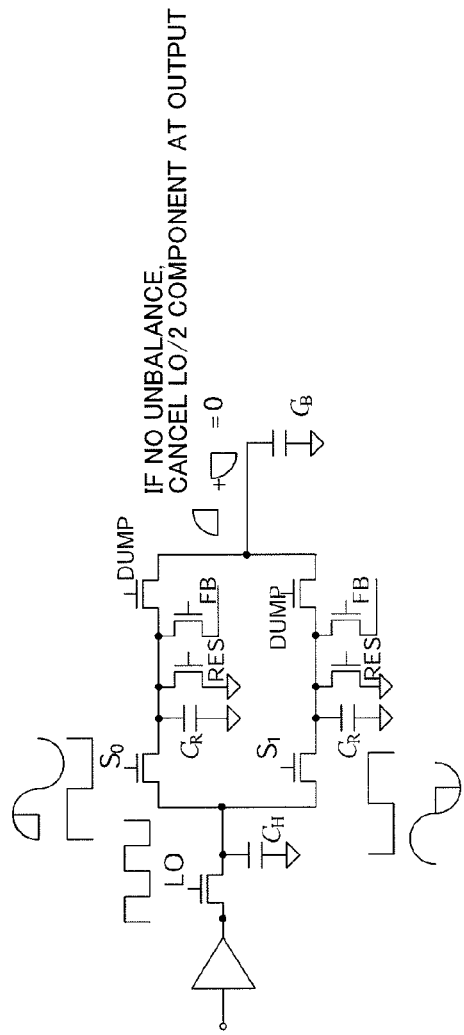
FIG. 9 explains the principle of occurrence of unnecessary spurious.
Figure 10:
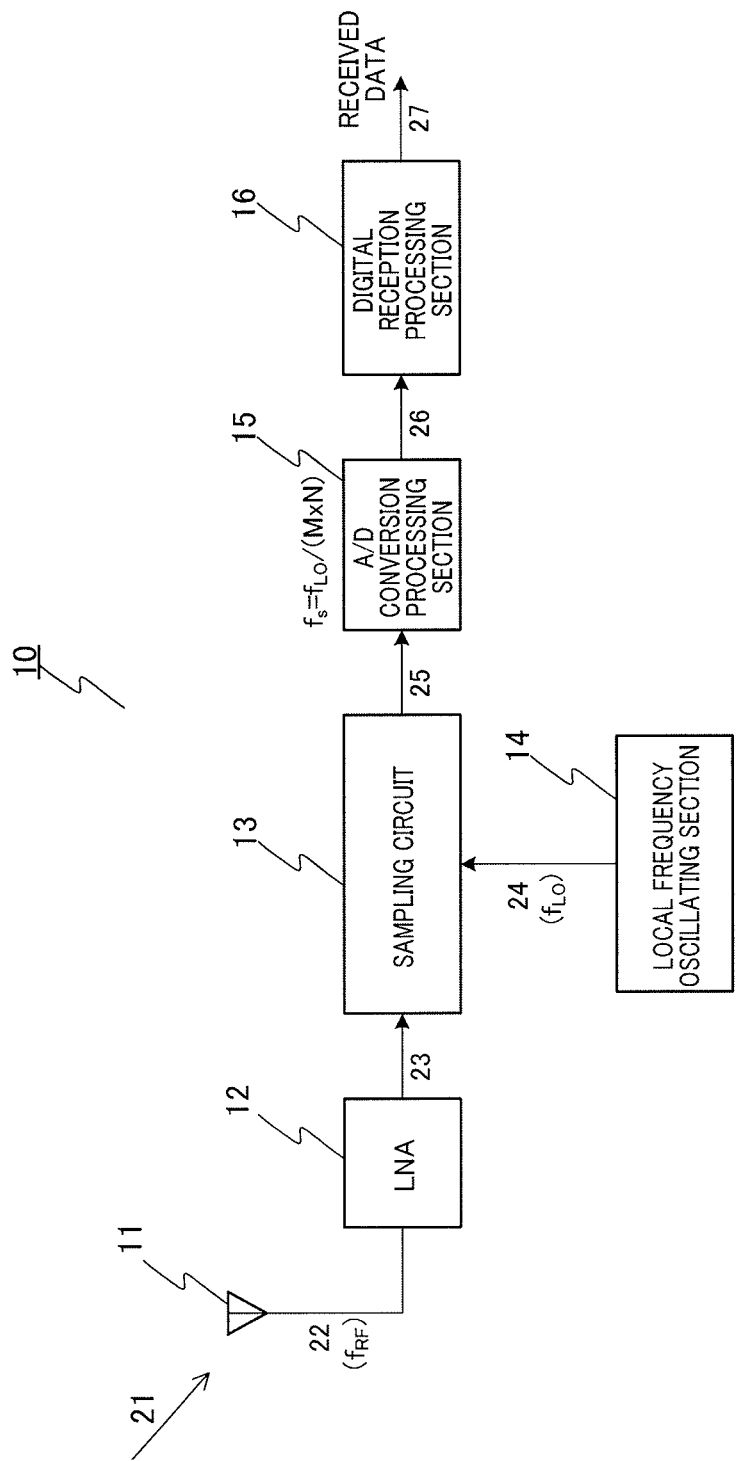
FIG. 10 is a block diagram showing a configuration of a sampling receiver according to Embodiment 1 of the present invention.

FIG. 10 shows a configuration of a sampling receiver according to the present embodiment. In FIG. 10, sampling receiver 10 has antenna 11, LNA (low noise amplifier) 12, sampling circuit 13, local frequency oscillating section 14, A/D (analog-to-digital) conversion processing section 15 and digital reception processing section 16.

This sampling receiver 10 receives electromagnetic wave 21 transmitted at carrier frequency $f_{RF}$, and applies discrete-time frequency conversion and filter processing on this received signal to extract a desired signal component. Then, sampling receiver 10 performs digital reception processing by converting to a digital signal, and outputs resultant received data 27.

Antenna 11 receives electromagnetic wave 21 transmitted at carrier frequency ($f_{RF}$) from a transmitting station (not shown) and converts it to analog RF signal 22. Low noise amplifier 12 amplifies analog RF signal 22 and outputs the result as analog RF signal 23.

Sampling circuit 13 receives amplified analog RF signal 23 and local frequency signal 24 as input. Then, sampling circuit 13 performs discrete-time frequency conversion and filter processing on analog RF signal 23 to extract only a desired signal component, and outputs resultant baseband signal 25.

Local frequency oscillating section 14 generates local frequency signal ($f_{LO}$) 24 used in sampling processing and frequency conversion processing, and outputs it to sampling circuit 13.

A/D conversion processing section 15 quantizes inputted baseband signal 25 into digital values at a predetermined sampling frequency and outputs converted digital baseband signal 26.

Digital reception processing section 16 performs predetermined digital reception processing, including demodulation, decoding and so forth, using inputted digital baseband signal 26, and outputs resultant received data 27.

Figure 11:
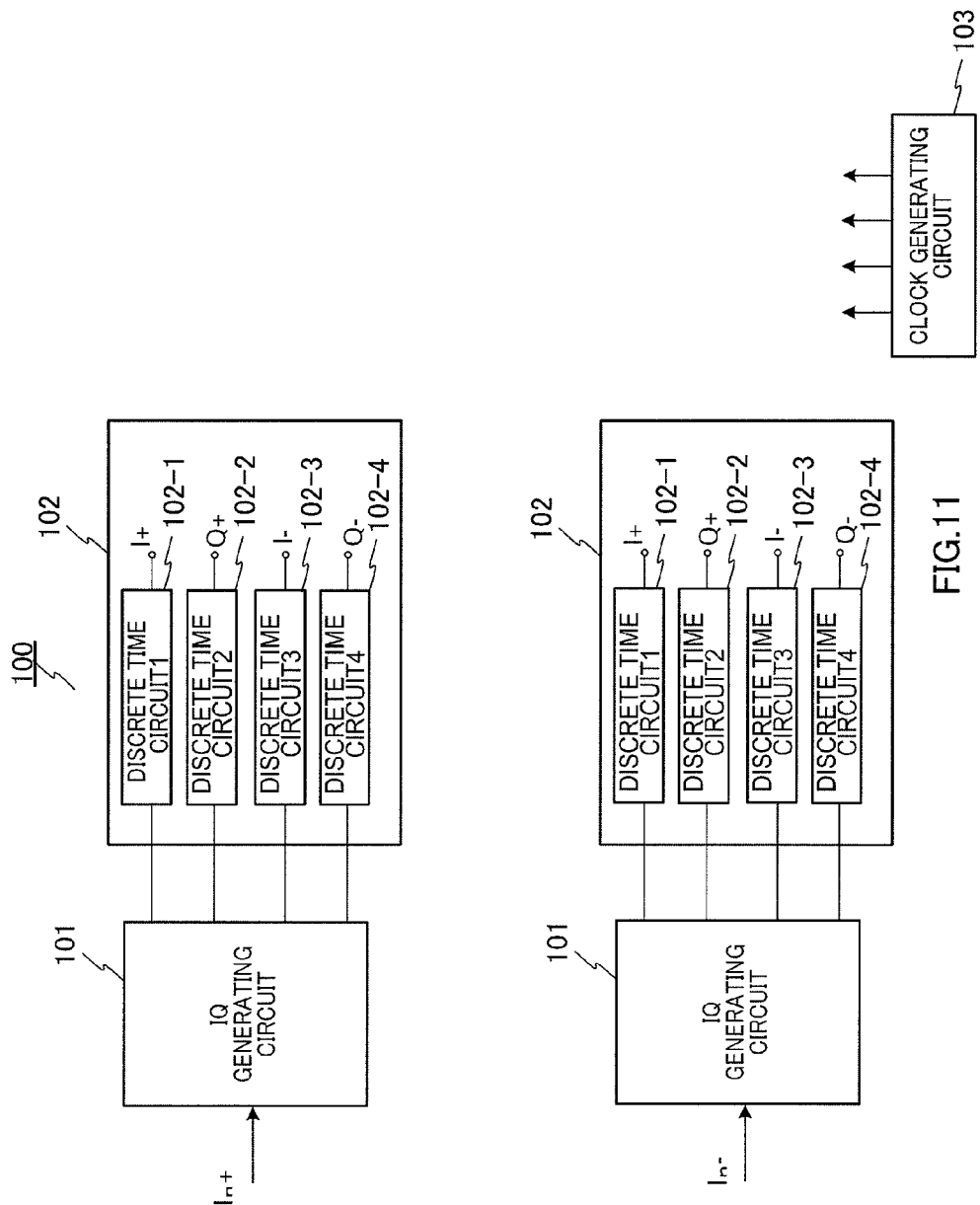
FIG. 11 is a block diagram showing a configuration of a sampling circuit according to Embodiment 1.

FIG. 11 shows the whole configuration of sampling circuit 100 according to the present embodiment, equivalent to sampling circuit 13 shown in FIG. 10.

Sampling circuit 100 has IQ generating circuit 101, discrete time circuit group 102 and clock generating circuit 103. Here, in FIG. 11, "In+" represents an input RF signal (positive-phase signal) inputted to sampling circuit 100, and "In−" represents a signal having a negative-phase (negative-phase signal) opposite to In+. Components are the same between IQ generating circuit 101 supporting positive-phase signals (In+) and IQ generating circuit 102 supporting negative-phase signals (In−), and are assigned the same reference numerals for illustrative purposes.

IQ generating circuit 101 performs frequency conversion and filter processing by converting an input RF signal from a voltage signal to a current signal and sampling the input RF signal every 90 degrees. That is, IQ generating circuit 101 generates four kinds of sample values (I+, Q+, I−, Q−) having phases 90 degrees shifted from each other.

Discrete time circuit group 102 has discrete time circuits 102-1 to 102-4, each having a rotate capacitor and a buffer capacitor. Then, each of discrete time circuits 102-1 to 102-4 switches the electrical charge sharing state between the rotate capacitor and the buffer capacitor to create output values.

Here, discrete time circuits 102-1 to 102-4 are connected to four kinds of sample values (I+, Q+, I−, Q−) outputted from IQ generating circuit 101, respectively. Discrete time circuits 102-1 to 102-4 add filter characteristics resulting from electrical charge sharing, to sample values, as electrical charge, and delivers the electrical charge to output capacitors via switches and capacitors described later to create output values.

Figure 12:
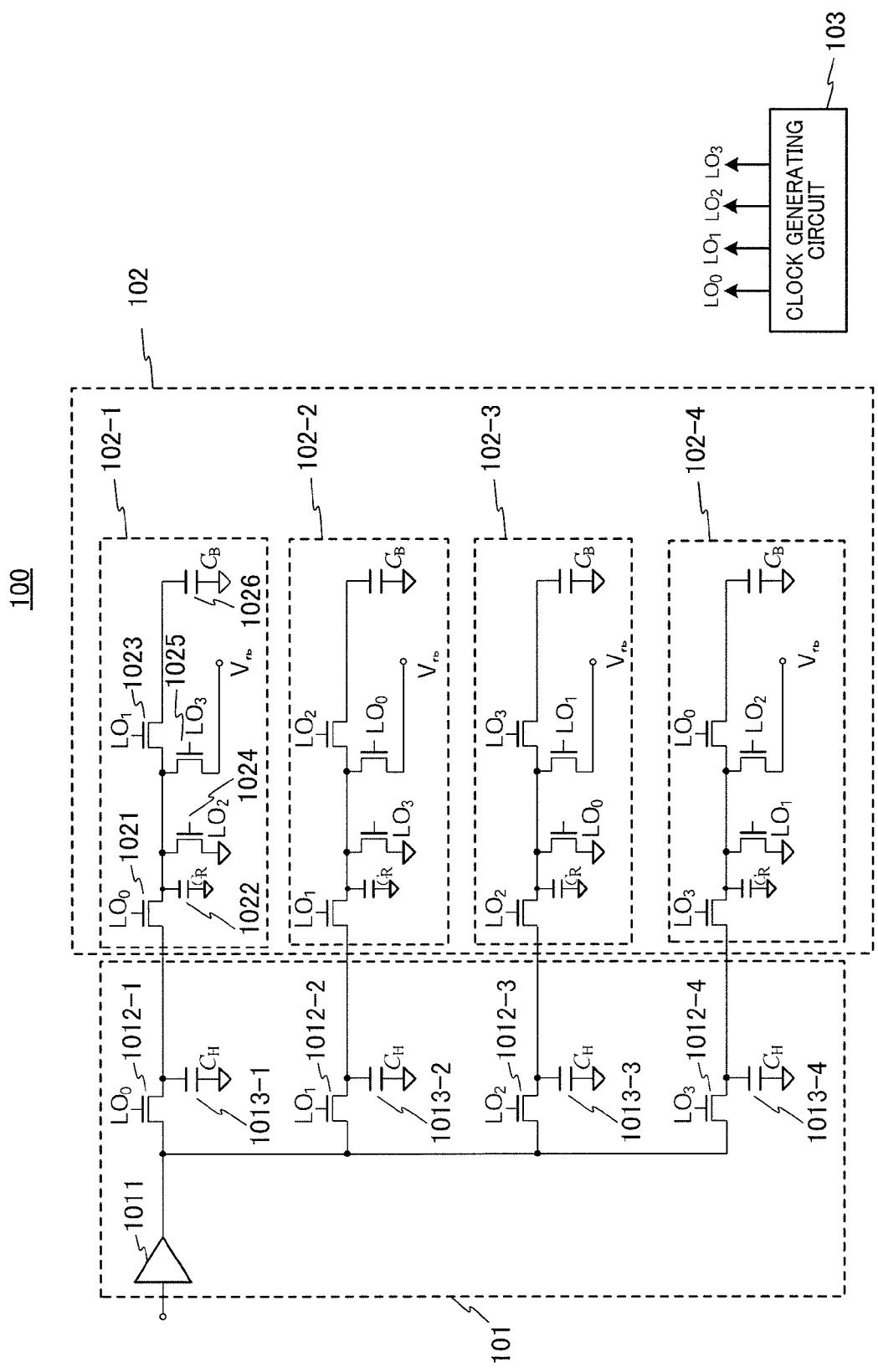
FIG. 12 is a connection diagram showing a configuration of the sampling circuit according to Embodiment 1.

FIG. 12 shows a more specific configuration of sampling circuit 100.

IQ generating circuit 101 has TA (transconductance amplifier) 1011, sampling switches 1012-1 to 1012-4 and history capacitors 1013-1 to 1013-4.

TA (transconductance amplifier) 1011 converts an input signal from a voltage signal to a current signal and outputs the current signal as an RF current signal.

Sampling switches 1012-1 to 1012-4 release an RF current to history capacitors 1013-1 to 1013-4, according to a local frequency signal outputted from local frequency oscillating section 14.

History capacitors 1013-1 to 1013-4 accumulate electrical charge supplied by the RF current sampled by sampling switches 1012-1 to 1012-4.

Each of discrete time circuits 102-1 to 102-4 has charging switch 1021, rotate capacitor 1022, dump switch 1023, reset switch 1024, precharge switch 1025 and buffer capacitor 1026.

Charging switch 1021 is connected between IQ generating circuit 101 and rotate capacitor 1022 to control to turn on and off a current to rotate capacitor 1022.

Rotate capacitor 1022 is connected to IQ generating circuit 101 via charging switch 1021.

Dump switch 1023 is connected between rotate capacitor 1022 and buffer capacitor 1026 to control to turn on and off a current to buffer capacitor 1026.

Reset switch 1024 controls to accumulate or discharge electrical charge in rotate capacitor 1022.

Precharge switch 1025 controls the DC voltage of rotate capacitor 1022.

Buffer capacitor 1026 is an output capacitor in sampling circuit 100, and is connected to rotate capacitor 1022 via dump switch 1023.

Sampling switches 1012-2 to 1012-4, charging switch 1021, dump switch 1023, reset switch 1024 and precharge switch 1025 are, for example, n-type FETs (field effect transistors). N-type FETs are turned on (conduct electricity) in a high gate voltage state (high), and turned off (disconnect) in a low gate voltage state (low).

Clock generating circuit 103 generates control signals $LO_0$, $LO_1$, $LO_2$ and $LO3$, based on a reference local frequency signal obtained from local frequency oscillating section 14 (FIG. 10). Then, clock generating circuit 103 supplies these control signals to IQ generating circuit 101 and discrete time circuit group 102.

Figure 13B:
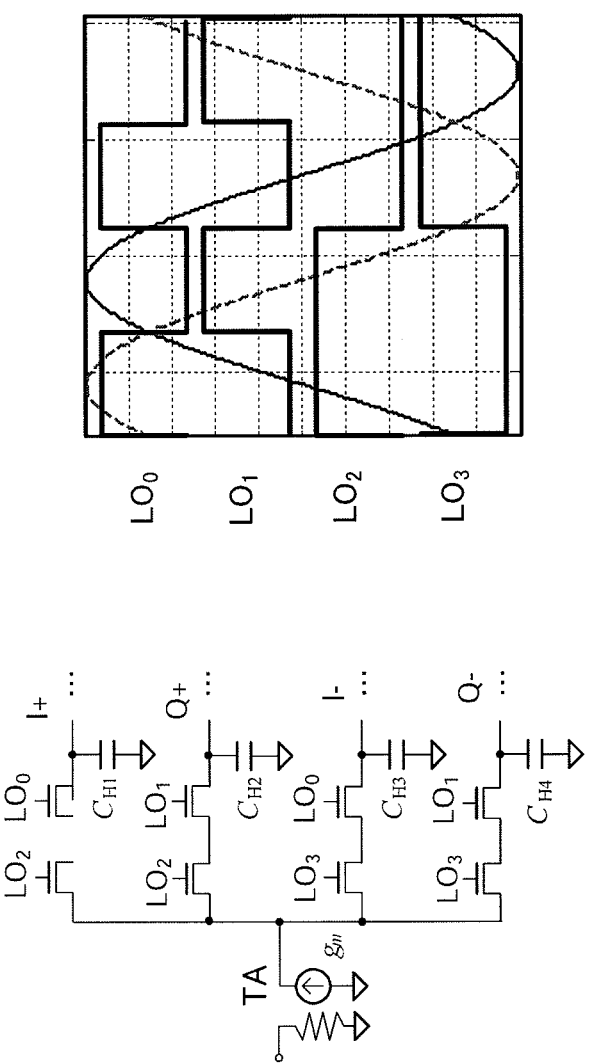
FIG. 13B includes a connection diagram showing another IQ generating circuit according to Embodiment 1 and a timing chart showing control signals.
Figure 13C:
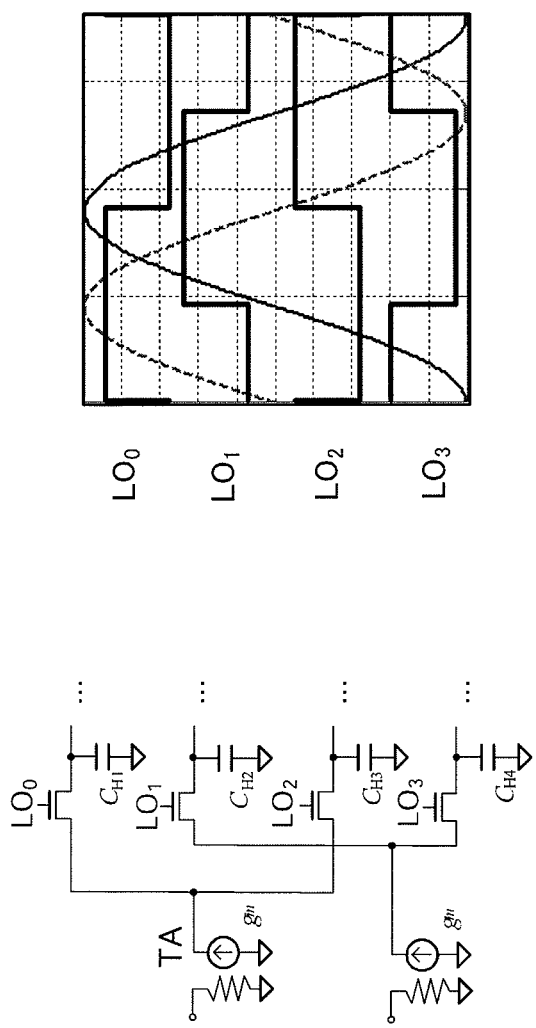
FIG. 13C includes a connection diagram showing further another IQ generating circuit according to Embodiment 1 and a timing chart showing control signals.

Each of FIG. 13A to FIG. 13C shows a configurations of IQ generating circuit 101 and examples of a timing chart showing control signals $LO_0$ to $LO_3$ outputted from clock generating circuit 103.

Here, FIG. 13A shows the configuration of IQ generating circuit 101 shown in FIG. 12 and a timing chart showing control signals $LO_0$ to $LO_3$ outputted from clock generating circuit 103. In addition, FIG. 13B and FIG. 13C show different configurations of IQ generating circuit 101 from in FIG. 13A. Moreover, FIG. 13B and FIG. 13C show examples of timing charts showing control signals $LO_0$ to $LO_3$ outputted from clock generating circuit 103 when IQ generating circuit 101 has these configurations.

In IQ generating circuit 101 shown in FIG. 13A, four sampling switches are connected to a TA (transconductance amplifier) in parallel, and history capacitors are connected to the sampling switches one-by-one, respectively.

Control signals $LO_0$ to $LO_3$ shown in FIG. 13A are high at times shifted from each other, and each high level period is ¼ of their signal period. That is, clock generating circuit 103 generates four-phase 25% duty ratio control signals $LO_0$ to $LO_3$. Control signals $LO_0$ to $LO_3$ are four-phase signals, which have nearly the same period as a desired RF signal period in low-IF system (∴ fLO=fRF+fIF), have a duty ratio of 25% and have phases a ¼ period shifted from each other.

IQ generating circuit 101 is formed such that control signals $LO_0$ to $LO_3$ being high at timings shifted from each other, are supplied to four sampling switches, respectively.

In IQ generating circuit 101 shown in FIG. 13B, four sets of sampling switches are connected to a TA (transconductance amplifier) in parallel, where a set of sampling switches are composed of two sampling switches. In addition, one history capacitor is connected to each of four sets of sampling switches.

Control signals $LO_0$ and $LO_1$ are high and low in the same period of time, and have a period ½ of a local signal period (fLO=fRF+fIF). Control signals $LO_2$ and $LO_3$ are high and low in the same period of time, and have the same period as a local signal period. That is, clock generating circuit 103 generates positive and negative-phase clock $LO_0$ and clock $LO_1$ having a duty ratio of 50% and having the period ½ of a local signal period. In addition, clock generating circuit 103 generates positive and negative-phase clock $LO_2$ and $LO_3$ having a duty ratio of 50% and having the same period as a local signal period. As described above, control signals $LO_0$ and $LO_1$ are two-phase signals, which have the period ½ of a local signal period, have a duty ratio of 50% and have phases a ½ period shifted from one another. In addition, $LO_2$ and $LO_3$ are two-phase signals, which have the same period as a local signal period, have a duty ratio of 50% and have phases a ½ period shifted from one another.

IQ generating circuit 101 shown in FIG. 13B has a configuration in which $LO_0$ or $LO_1$ is supplied to one of two switches arranged serially, and $LO_2$ or $LO_3$ is supplied to the other switch, and can operate like IQ generating circuit 101 shown in FIG. 13A.

In IQ generating circuit 101 shown in FIG. 13C, two TAs (transconductance amplifiers) that convert an inputted RF voltage signal to current signal are provided, and two sampling switches are connected to the output of each TA.

Control signals $LO_0$ to $LO_3$ are high at times shifted from each other, and each high level period is ½ of a local signal period (fLO=fRF+fIF). That is, clock generating circuit 103 generates four-phase 50% duty ratio control signals $LO_0$ to $LO_3$ having phases 90 degrees shifted from each other. As described above, control signals $LO_0$ to $LO_3$ are four-phase signals, which have the same period as a local signal period, have a duty ratio of 50% and have phases a ¼ period shifted from each other.

In IQ generating circuit 101 shown in FIG. 13, control signals $LO_0$ and $LO_2$ are supplied to sampling switches of a TA output, and control signals $LO_1$ and $LO_3$ are supplied to sampling switches of another TA output. By this means, IQ generating circuit 101 shown in FIG. 13C can operate like in FIG. 13A.

With the configurations shown in FIG. 13A to FIG. 13C, IQ generating circuit 101 generates four kinds of sample values (I+, Q+, I−, Q−).

Now, operation of sampling circuit 100 will be explained, using IQ generating circuit 101 having the configuration shown in FIG. 13A as an example.

Figure 14:
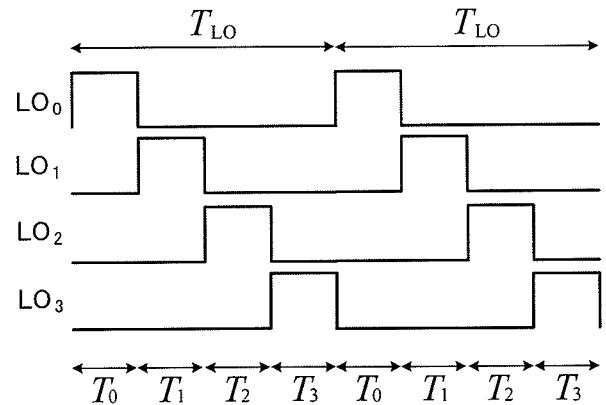
FIG. 14 is a timing chart showing control signals $LO_0$ to $LO_3$ outputted from a clock generating circuit.
Figure 15:
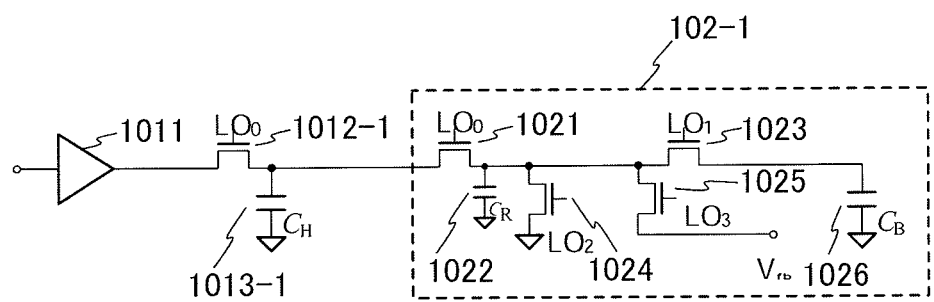
FIG. 15 shows the top stage supporting I+ signals, extracted from the configuration of the sampling circuit shown in FIG. 12.

FIG. 14 is a timing chart showing control signals $LO_0$ to $LO_3$ outputted from clock generating circuit 103. $LO_0$, $LO_1$, $LO_2$ and $LO_3$ are high during periods of time $T_0$, $T_1$, $T_2$ and $T_3$, respectively. As seen from FIG. 12 and FIG. 14, respective circuit supporting four kinds of sample values (I+, Q+, I−, Q−) similarly operate with delay for $T_{LO}/4$. FIG. 15 shows the top circuit supporting I+ signals, extracted from components in sampling circuit 100 shown in FIG. 12, and operation of that will be explained.

FIG. 16A to FIG. 16D show situations in which connections between components shown in FIG. 15 are switched as control signals $LO_0$, $LO_1$, $LO_2$ and $LO_3$ are high in this order. Now, operation will be explained at the timing each of $LO_0$, $LO_1$, $LO_2$ and $LO_3$ is high.

First, TA (transconductance amplifier) 1011 converts inputted RF signal 23 to an analog current signal.

[1] Period $LO_0$ is High

Figure 16A:
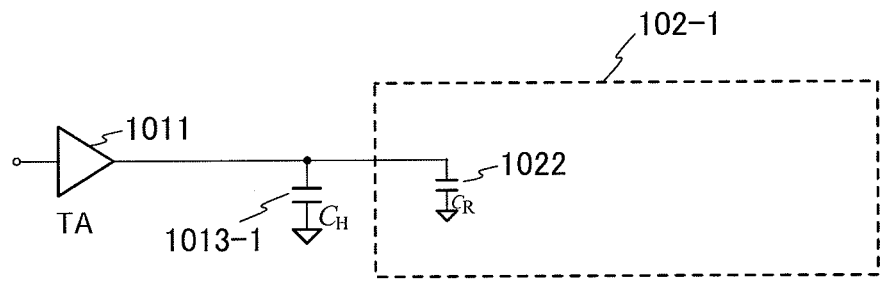
FIG. 16 shows situations in which the connection shown in FIG. 15 is switched according to control signals $LO_0$, $LO_1$, $LO_2$ and $LO_3$ being high in turn.

In the period $LO_0$ is high (period of time $T_0$), as shown in FIG. 16A, an output of TA (transconductance amplifier) 1011 is connected to history capacitor 1013-1 and rotate capacitor 1022 via sampling switch 1012-1 and charging switch 1021. Then, an inputted current is sampled as electrical charge, so that frequency conversion is performed.

To be more specific, while $LO_0$ is high, and sampling switch 1012-1 and charging switch 1021 are turned on, the following electrical charge $Q_{in}$ and $Q_{ch}$ are shared.

$Q_{in}$ a: electrical charge obtained by converting an inputted RF signal to a current signal in TA (transconductance amplifier) 1011.

For example, assume that an input voltage is $V_{in}[V]$ and TA (transconductance amplifier) 1011 has conductance value $g_m[S]$, the output of TA (transconductance amplifier) 1011 is a current $I_{in}=g_mV_{in}[A]$. This current is inputted to history capacitor 1013-1 during $T_{LO}/4$. Here, assume that an inputted RF signal is $V_{in} \sin(\omega_{RF}t)$, it is possible to derive $Q_{in}$ from equation 1.

(Equation 1)
$$Q_{in} = \int_{T_S/8}^{3T_S/8} g_m V_{in} \sin(\omega_{RF}t)dt \quad [1]$$

Here, if direct sampling is performed, $T_s=T_{LO}$ and $\omega_{RF}=\omega_{LO}$, so that equation 1 becomes equation 2.

(Equation 2)
$$\begin{aligned} Q_{in} &= \int_{T_{LO}/8}^{3T_{LO}/8} g_m V_{in} \sin(\omega_{LO}t)dt \\ &= \frac{g_m V_{in}}{\omega_{LO}}[-\cos(\omega_{LO}t)]_{T_{LO}/8}^{3T_{LO}/8} \\ &= \frac{g_m T_{LO} V_{in}}{2\pi}\left[\cos\frac{\pi}{4} - \cos\frac{3\pi}{4}\right] \\ &= \frac{g_m T_{LO}}{\pi\sqrt{2}} V_{in} \end{aligned} \quad [2]$$

$Q_{ch}$ represents electrical charge $T_{LO}$ period of time before, which is accumulated in history capacitor 1013-1.

As seen from FIG. 12 and FIG. 14, history capacitor 1013-1 performs electrical charge sharing every $T_{LO}$.

Assume that the voltage obtained after electrical charge sharing is $v_1(n)$ during this period of time $T_O$, it is possible to describe the voltage having been obtained during last period of time $T_O$ as $v_1(n-1)$. Therefore, it is possible to represent $Q_{ch}$ as equation 3.

[3]

$$Q_{ch} = C_H v_1(n-1) \quad \text{(Equation 3)}$$

That is, it is possible to describe the electrical charge sharing during period of time $T_0$ as equation 4.

(Equation 4)

$$Q_{in} + Q_{ch} = \frac{g_m T_{LO}}{\pi\sqrt{2}} v_{in} + C_H v_1(n-1) = (C_R + C_H) v_1(n) \quad [4]$$

This equation is converted in the z domain and organized to obtain equation 5.

(Equation 5)

$$\frac{V_1}{V_{in}} = \frac{g_m T_{LO}}{\pi\sqrt{2}} \cdot \frac{1}{C_R + C_H(1 - z^{-1})} \quad [5]$$

[2] Period $LO_1$ is High

Figure 16B:
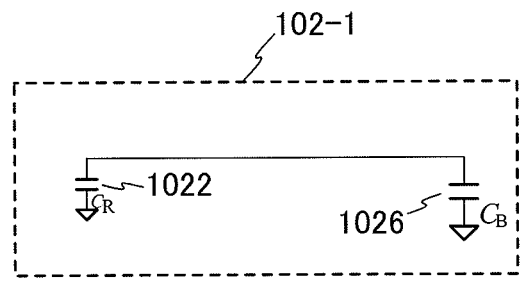

In the period $LO_1$ is high (period of time $T_1$), as shown in FIG. 16B, rotate capacitor 1022 and buffer capacitor 1026 are connected via dump switch 1023 to obtain an output value by electrical charge sharing. The voltage of the output value obtained by electrical charge sharing during this period of time $T_1$ is represented as $V_{out}(n)$, and the voltage of the output value obtained by electrical charge sharing during last period of time $T_1$ is represented as $V_{out}(n-1)$, and then, the above-described period of time $T_o$ in [1] is applied here. Then, it is possible to describe the difference equation as equation 6.

[6]

$$C_R v_1(n-1) + C_B v_{out}(n-1) = (C_R + C_B) v_{out}(n) \quad \text{(Equation 6)}$$

This equation is converted in the z domain and organized to obtain equation 7.

(Equation 7)

$$\frac{V_{out}}{V_1} = \frac{z^{-1} C_R}{C_R + C_B(1 - z^{-1})} \quad [7]$$

Equation 5 and equation 7 are organized to calculate the entire transfer function, so that it is possible to obtain equation 8.

(Equation 8)

$$\frac{V_{out}}{V_{in}} = \frac{g_m T_{LO}}{\pi\sqrt{2}} \cdot \frac{1}{C_R + C_H(1 - z^{-1})} \cdot \frac{C_R z^{-1}}{C_R + C_B(1 - z^{-1})} \quad [8]$$

[3] Period $LO_2$ is High

Figure 16C:
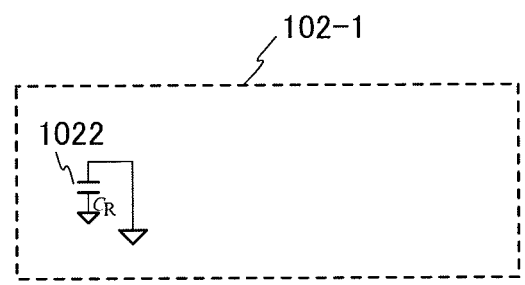

In the period $LO_2$ is high (period of time $T_2$), as shown in FIG. 16C, rotate capacitor 1022 is connected to a power supply with low impedance or ground via reset switch 1024.

By this means, the electrical charge accumulated in rotate capacitor 1022 is discharged. In this way, during period of time $T_2$, it is possible to discharge the electrical charge accumulated in rotate capacitor 1022 to reset rotate capacitor 1022. Therefore, during subsequent period of time $T_3$, it is possible to apply a predetermined DC voltage to rotate capacitor 1022, so that it is possible to provide an appropriate bias voltage as the initial voltage for sampling. In addition, operation according to equation 8 is performed by resetting the electrical charge in rotate capacitor 1022, so that it is possible to control conversion gain according to the capacity of the rotate capacitor.

[4] Period $LO_3$ is High

Figure 16D:
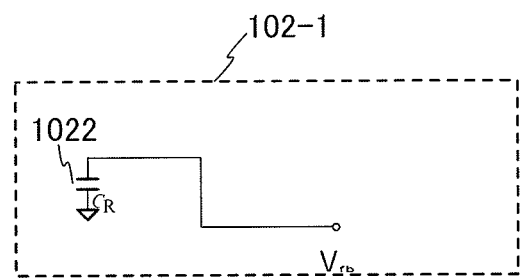

In the period $LO_3$ is high (period of time $T_4$), as shown in FIG. 16D, the DC voltage of rotate capacitor 1022 is set to Vfb via precharge switch 1025 and electrical charge is precharged into rotate capacitor 1022. At this time, it is possible to improve linearity by defining Vfb as a DC voltage to allow improvement of linearity.

Then, the above described four kinds of operation [1] to [4] are repeatedly performed. In addition, in the circuits supporting other three kinds of sample values (Q+, I−, I+) in FIG. 12, the same steps as described above are sequentially performed with delay for a period ¼ of the LO frequency.

As described above, according to the present embodiment, clock generating circuit 103 outputs four-phase control signals having phases shifted from each other by a ¼ period of the carrier frequency of an inputted RF signal. IQ generating circuit 101 forms four kinds of sample values having phases 90 degrees shifted from each other by sampling an inputted RF signal. Discrete time circuit group 102 has discrete time circuits 102-1 to 102-4 connected to four kinds of sample values, respectively. Each of discrete time circuits 102-1 to 102-4 has rotate capacitor 1022 and buffer capacitor 1026. Then, with the present embodiment, an output value is formed by switching the state of electrical charge sharing between rotate capacitor 1022 and buffer capacitor 1026 every ¼ period of the carrier frequency of an inputted RF signal.

To be more specific, IQ generating circuit 101 samples an input signal according to four-phase control signals, and accumulates four kinds of sample values having different phases as electrical charge. Each of discrete time circuits 102-1 to 102-4 has charging switch 1021, rotate capacitor 1022 connected to IQ generating circuit 101 via charging switch 1021, dump switch 1023 and buffer capacitor 1026 connected to rotate capacitor 1022 via dump switch 1023. Then, charging switch 1021 is controlled on and off using the same signal as a control signal used to sample a sample value of electrical charge to be shared, among four-phase control signals. Rotate capacitor 1022 shares electrical charge accumulated in IQ generating circuit 101 via charging switch 1021. Dump switch 1023 is controlled on and off using a signal having the different phase from the phase of a control signal to control charging switch 1021 on and off. Buffer capacitor 1026 forms an output value by sharing electrical charge with a rotate capacitor via dump switch 1023.

It is possible to reduce the operating frequency of a discrete time circuit by connecting a plurality of prepared rotate capacitors to a buffer capacitor in turn. However, in this case, if there is difference between rotate capacitors, spurious of each control signal occurs in an output. By contrast with this, according to the present embodiment, each of discrete time circuits 102-1 to 102-4 includes only one rotate capacitor 1022 connected to buffer capacitor 1026. Therefore, it is possible to prevent occurrence of spurious in an output value.

In addition, IQ generating circuit 101 has TA (transconductance amplifier) 1011 that converts an input signal from a voltage signal to a current signal and output the current signal, sampling switches 1012-1 to 1012-4 that sample the current signal according to control signals and output four kinds of current signals and history capacitors 1013-1 to 1013-4 that accumulate four kinds of electrical charge supplied by sampled current signals. Each of discrete time circuits 102-1 to 102-4 further includes reset switch 1024 that controls to accumulate or discharge electrical charge in rotate capacitor 1022 and precharge switch 1025 that controls the DC voltage of rotate capacitor 1022. Then, charging switch 1021, dump switch 1023, reset switch 1024 and precharge switch 1025 are controlled on and off in this order, using four-phase control signals.

By this means, charging switch 1021, dump switch 1023, reset switch 1024 and precharge switch 1025 are controlled on and off in this order with respective delay ¼ of the carrier frequency of an inputted RF signal. As a result of this, each of discrete time circuits 102-1 to 102-4 grounds and resets the electrical charge remaining in rotate capacitor 1022 by reset switch 1024 every time forming an output value. Moreover, in each of discrete time circuits 102-1 to 102-4, precharge switch 1025 can define the DC voltage of rotate capacitor 1022 using Vfb. As described above, according to the present embodiment, a voltage is applied to rotate capacitor 1022 after rotate capacitor 1022 is reset once. By this means, rotate capacitor 1022 performs next charging, so that it is possible to improve linearity by setting Vfb to an appropriate DC voltage.

In addition, it is preferable to provide only four-phase control signals which are high at different timings and have high level periods shifted from each other, for charging switch 1021 dump switch 1023, reset switch 1024 and precharge switch 1025. In this case, control signals $LO_0$ to $LO_3$ may be used as four-phase control signals in order to sample four kinds of sample values (I+, Q+, I−, Q−) in IQ generating circuit 101. Here, control signals $LO_0$ to $LO_3$ are supplied from clock generating circuit 103 to sampling switches 1012-1 to 1012-4. Therefore, a circuit is not required to generate a new control signal.

Here, charging switch 1021 may be controlled on and off using any one of four-phase control signals. In this case, the transfer function is different from the above-described equation 8. However, the frequency characteristic in this case does not deteriorate greatly more than the frequency characteristic in a case in which charging switch 1021 is controlled on and off using the same signal as the control signal used to sample a sample value of electrical charge to be shared, among four-phase control signals. That is, it is possible to produce the same effect as described above.

Embodiment 2

Figure 17:
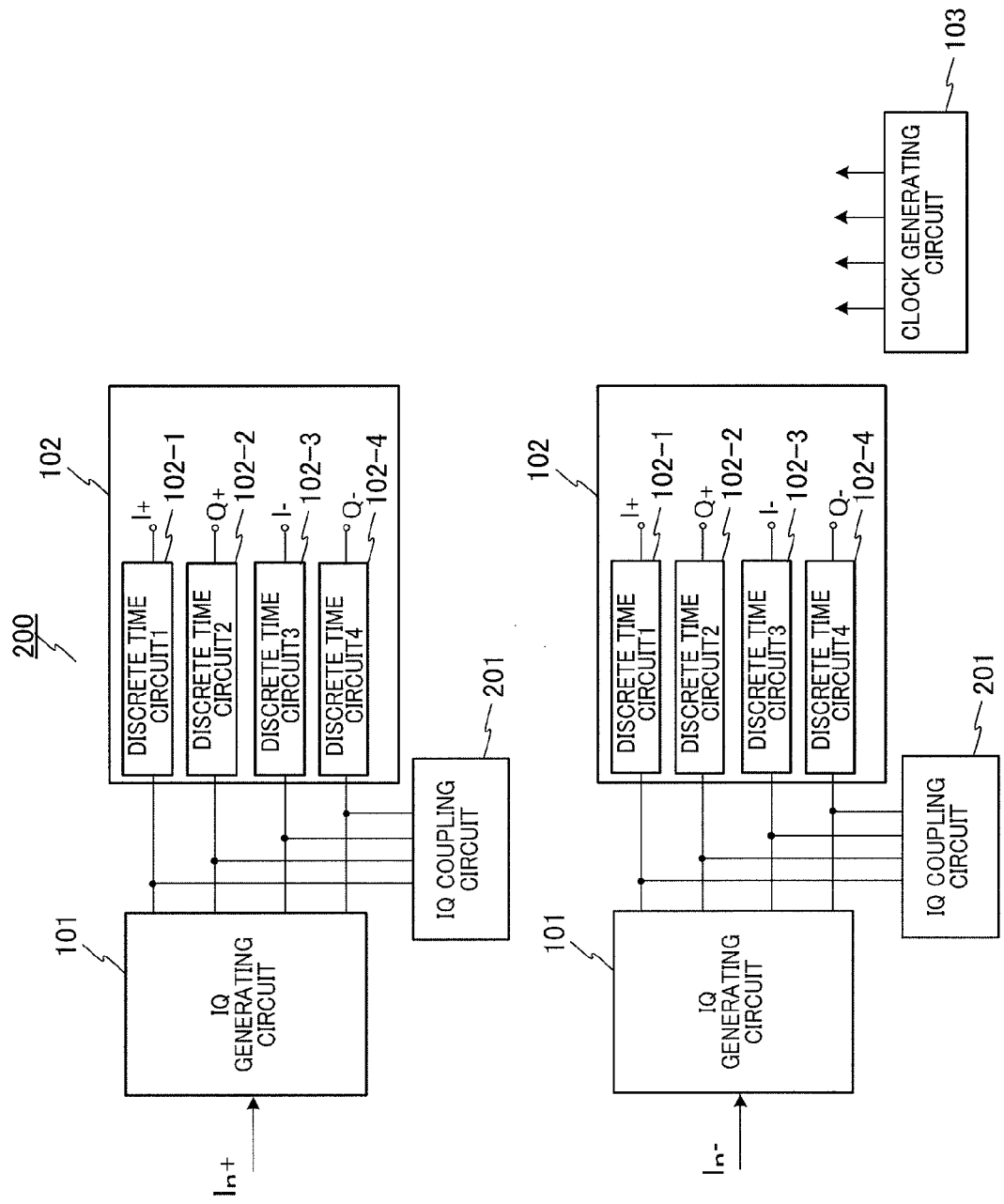
FIG. 17 is a block diagram showing a configuration of a sampling circuit according to Embodiment 2 of the present invention.

FIG. 17 shows a configuration of a sampling circuit according to the present embodiment. Sampling circuit 200 shown in FIG. 17 adopts a configuration in which IQ coupling circuit 201 is added to sampling circuit 100 shown in FIG. 12. Here, in sampling circuit 200 according to the present embodiment shown in FIG. 17, the same components as in sampling circuit 100 shown in FIG. 12 are assigned the same reference numerals and descriptions will be omitted.

Sampling circuit 200 has IQ generating circuit 101, IQ coupling circuit 201, discrete time circuit group 102 and clock generating circuit 103.

IQ coupling circuit 201 couples four kinds of sample values having phases 90 degrees shifted from each other by exchanging electrical charge among these four kinds of sample values to realize a complex coefficient in the denominator in a transfer function.

Figure 18:
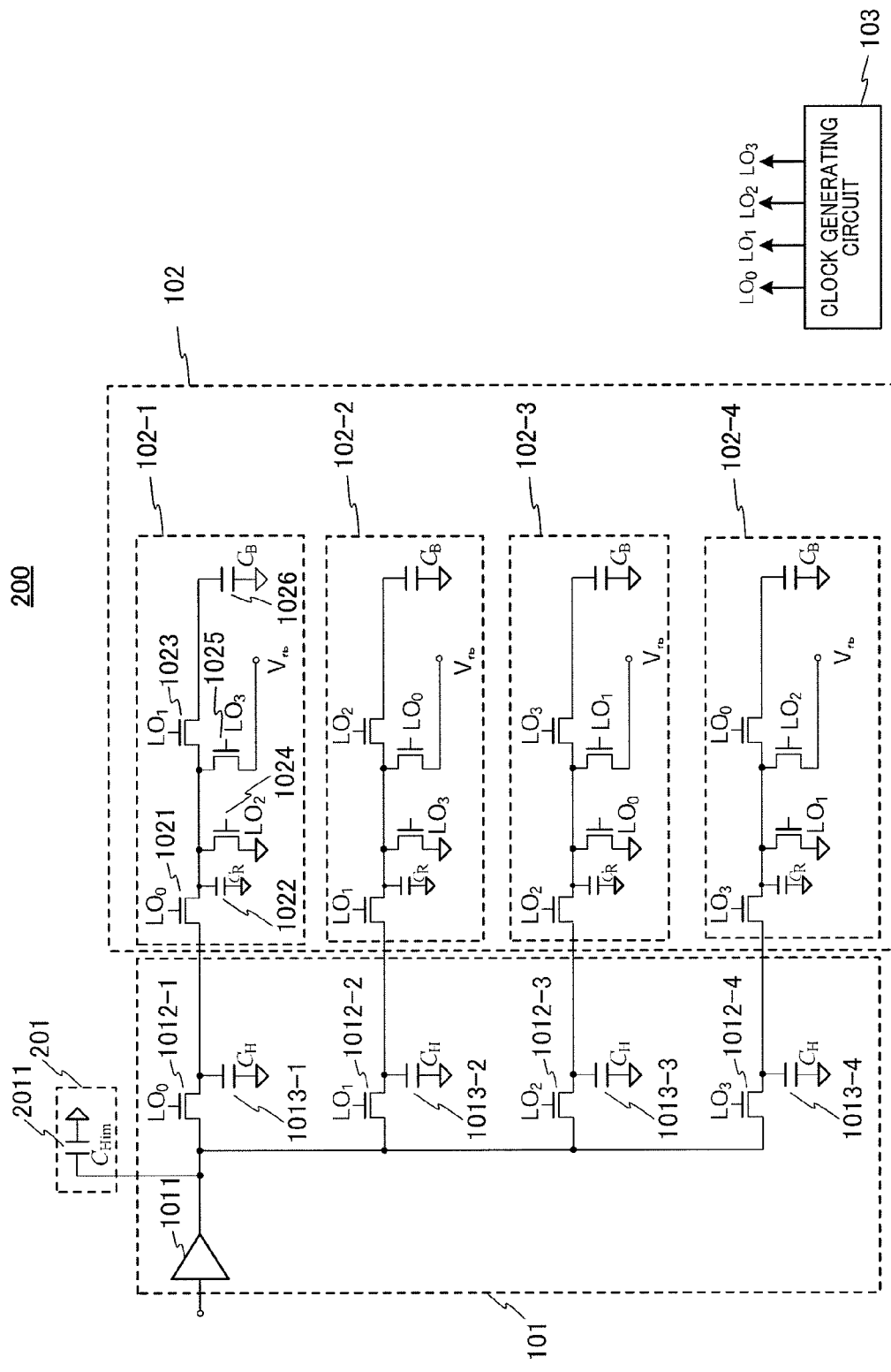
FIG. 18 is a connection diagram showing a configuration of the sampling circuit according to Embodiment 2.

FIG. 18 shows a more specific configuration of sampling circuit 200.

IQ coupling circuit 201 has capacitor 2011. Here, capacitor 2011 will be referred to as an imaginary number capacitor in order to realize a complex coefficient in the denominator in a transfer function as described later.

Each of discrete time circuits 102-1 to 102-4 forms an output value by switching the state of electrical charge sharing among rotate capacitor 1022, buffer capacitor 1026 and imaginary number capacitor 2011 in IQ coupling circuit 201.

Figure 19:
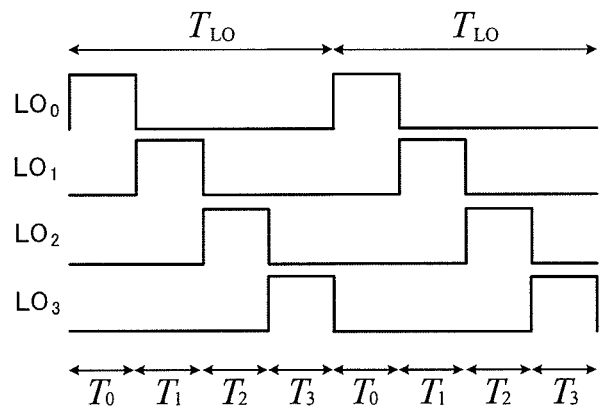
FIG. 19 is a timing chart showing control signals $LO_0$ to $LO_3$ outputted from a clock generating circuit.
Figure 20:
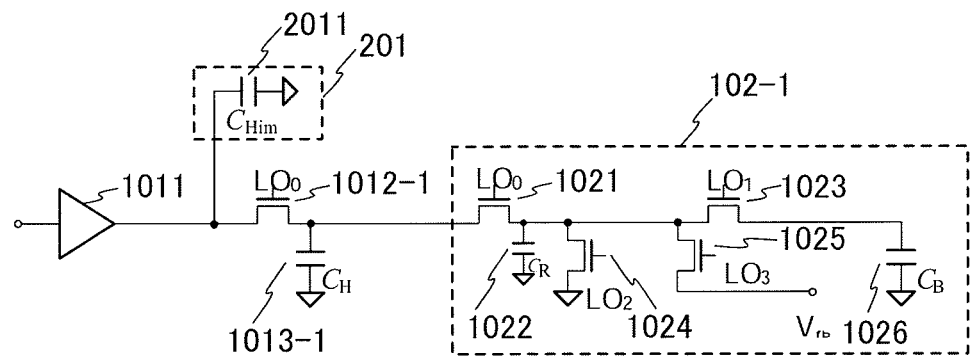
FIG. 20 shows the top stage supporting I+ signals, extracted from the configuration of the sampling circuit shown in FIG. 18.

FIG. 19 is a timing chart showing control signals $LO_0$ to $LO_3$ outputted from clock generating circuit 103. Control signals $LO_0$, $LO_1$, $LO_2$ and $LO_3$ are high during periods of time $T_0$, $T_1$, $T_2$ and $T_3$, respectively. As seen from FIG. 18 and FIG. 19, respective circuits supporting four kinds of sample values (I+, Q+, I−, Q−) operate with delay for $T_{LO}/4$. FIG. 20 shows the top circuit supporting I+ signals, extracted from components of sampling circuit 200 shown in FIG. 18, and operation of that will be explained.

FIG. 21A to FIG. 21D show situations in which connections between components shown in FIG. 20 are switched as control signals $LO_0$, $LO_1$, $LO_2$ and $LO_3$ are high in turn. Now, operation will be explained at the timing each of $LO_0$, $LO_1$, $LO_2$ and $LO_3$ are high.

First, TA (transconductance amplifier) 1011 converts inputted RF signal 23, to an analog current signal.

[1] Period $LO_0$ is High

Figure 21A:
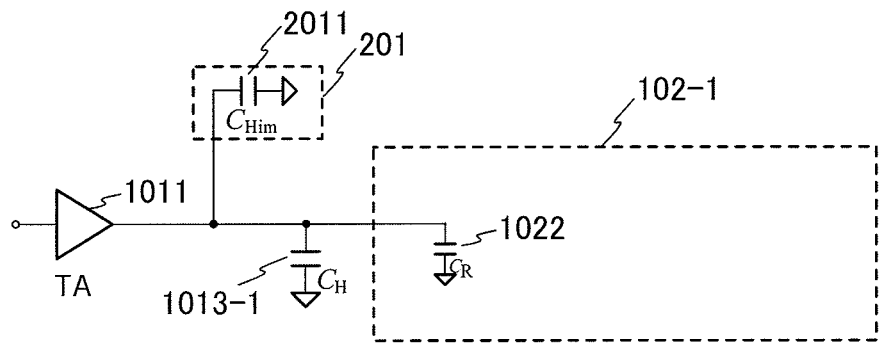
FIG. 21 shows situations in which the connection shown in FIG. 20 is switched according to control signals $LO_0$, $LO_1$, $LO_2$ and $LO_3$ being high in turn.

In the period $LO_0$ is high (period of time $T_0$), as shown in FIG. 21A, an output of TA (transconductance amplifier) 1011 is connected to history capacitor 1013-1, imaginary number capacitor 2011 and rotate capacitor 1022 via sampling switch 1012-1 and charging switch 1021. By this means, an inputted current is sampled as electrical charge, so that frequency conversion is performed.

To be more specific, while $LO_0$ is high, and sampling switch 1012-1 and charging switch 1021 are turned on, the following three kinds of electrical charge $Q_{in}$, $Q_{ch}$ and $Q_{CHim}$ are shared. Here, electrical charge $Q_{in}$ and $Q_{ch}$ are the same as in Embodiment 1, so that only $Q_{CHim}$ will be explained.

$Q_{CHim}$ represents electrical charge a $T_{LO}/4$ period of time before, which is accumulated in imaginary number capacitor 2011.

As seen from FIG. 18 and FIG. 19, imaginary number capacitor 2011 performs electrical charge sharing every $T_{LO}/4$. Therefore, as described above, assume that the voltage obtained after electrical charge sharing is $v_1(n)$ during this period of time $T_0$, electrical charge accumulated in imaginary number capacitor 2011 is the voltage π/2 before this period of time $T_0$.

Here, assume that an inputted RF signal during this period of time $T_0$ is $V_{in}e^{j\omega t}$. In this case, the inputted RF signal π/2 before is $V_{in}e^{j(\omega t - \pi/2)} = V_{in}e^{j\omega t}e^{-j\pi/2}$ and represented as $-jV_{in}e^{j\omega t} = -jv_1(n)$ according to Euler's formula. Therefore, $Q_{CHim}$ is represented as equation 9.

[9]

$$Q_{CHim} = -jC_{Him}v_1(n) \quad \text{(Equation 9)}$$

That is, it is possible to describe the electrical charge sharing during period of time $T_0$ as equation 10.

(Equation 10)

$$Q_{in} + Q_{ch} + Q_{CHim} = \frac{g_m T_{LO}}{\pi\sqrt{2}} v_{in} + C_H v_1(n-1) - jC_{Him}v_1(n) \quad [10]$$
$$= (C_R + C_H + C_{Him})v_1(n)$$

This equation is converted in the z domain and organized to obtain equation 11.

(Equation 11)

$$\frac{V_1}{V_{in}} = \frac{g_m T_{LO}}{\pi\sqrt{2}} \cdot \frac{1}{C_R + C_{Him} + C_H + jC_{Him} - z^{-1}C_H} \quad [11]$$

[2] Period $LO_1$ is High

Figure 21B:
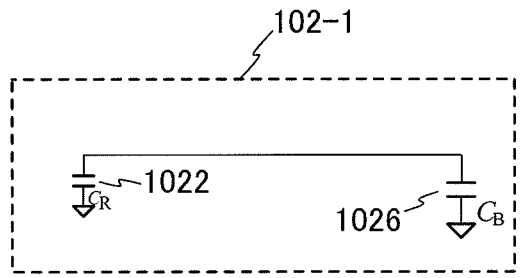

In the period $LO_1$ is high (period of time $T_1$), as shown in FIG. 21B, rotate capacitor 1022 and buffer capacitor 1026 are connected via dump switch 1023 to obtain an output value by electrical charge sharing. The voltage of the output value obtained by electrical charge sharing during this period of time $T_1$ is represented as $V_{out}(n)$, and the voltage of the output value obtained by electrical charge sharing during last period of time $T_1$ is represented as $V_{out}(n-1)$, and then, the above-described period of time $T_o$ in [1] is applied here. Then, it is possible to describe the difference equation as equation 12.

[12]

$$C_R v_1(n-1) + C_B v_{out}(n-1) = (C_R + C_B)v_{out}(n) \quad \text{(Equation 12)}$$

This equation is converted in the z domain and organized to obtain equation 13.

(Equation 13)

$$\frac{V_{out}}{V_1} = \frac{z^{-1}C_R}{C_R + C_B(1 - z^{-1})} \quad [13]$$

Equation 11 and equation 13 are organized to calculate the entire transfer function, so that it is possible to obtain equation 14.

(Equation 14)

$$\frac{V_{out}}{V_{in}} =$$

$$\frac{g_m T_{LO}}{\pi\sqrt{2}} \cdot \frac{1}{C_R + C_{Him} + C_H + jC_{Him} - z^{-1}C_H} \cdot \frac{C_R z^{-1}}{C_R + C_B(1 - z^{-1})} \quad [14]$$

As a result of this, a complex coefficient is realized in the denominator in the transfer function.

[3] Period $LO_2$ is High

Figure 21C:
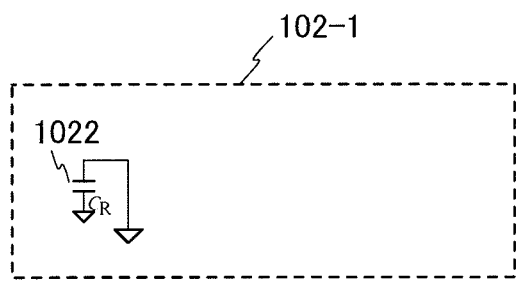

In the period $LO_2$ is high (period of time $T_2$), as shown in FIG. 21C, rotate capacitor 1022 is connected to a power supply with low impedance or ground via reset switch 1024. By this means, the electrical charge accumulated in rotate capacitor 1022 is discharged. In this way, during period of time $T_2$, it is possible to discharge the electrical charge accumulated in rotate capacitor 1022 to reset rotate capacitor 1022. Therefore, during subsequent period of time $T_3$, it is possible to apply a predetermined voltage to rotate capacitor 1022, so that it is possible to provide an appropriate bias voltage as the initial voltage for sampling.

[4] Period $LO_3$ is High

Figure 21D:
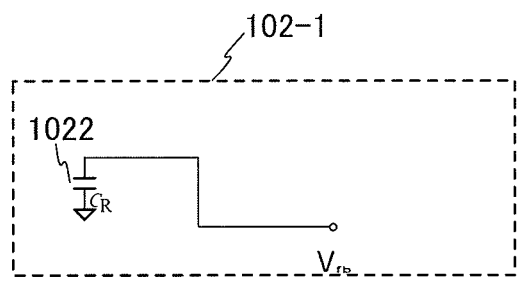

In the period $LO_3$ is high (period of time $T_3$), as shown in FIG. 21D, the bias voltage of rotate capacitor 1022 is set to Vfb and electrical charge is precharged into rotate capacitor 1022. At this time, it is possible to improve linearity by defining Vfb as a DC voltage to allow improvement of linearity.

Then, the above described four steps [1] to [4] are repeatedly performed. In addition, in the circuits supporting other three kinds of sample values (Q+, I−, I+) in FIG. 18, the same steps as described above are sequentially performed with delay for a period ¼ of LO.

As described above, with the present embodiment, IQ coupling circuit 201 couples four kinds of sample values having different phases. Each of discrete time circuits 102-1 to 102-4 switches the state of electrical charge sharing among rotate capacitor 1022, buffer capacitor 1026 and IQ coupling circuit 201. During the period charging switch 1021 is turned on, rotate capacitor 1022 shares electrical charge accumulated in IQ generating circuit 101 and electrical charge coupled in IQ coupling circuit 201. By providing IQ coupling circuit 201, it is possible to realize a complex coefficient in the denominator in a transfer function, with simple clocks, and consequently shift the center of frequency characteristics to the low frequency side. In addition, circuit element values contributing change in frequency characteristics in sampling circuit 200 are four kinds of capacitance values, which are respective capacitance values of history capacitors 1012-1 to 1012-4, imaginary number capacitor 2011, rotate capacitor 1022 and buffer capacitor 1026. Therefore, the design flexibility is improved, and, by adjusting these four capacitor capacitance values, it is possible to control the amount of central shift, cutoff frequency and gain, and consequently obtain excellent frequency characteristics.

Figure 22B:
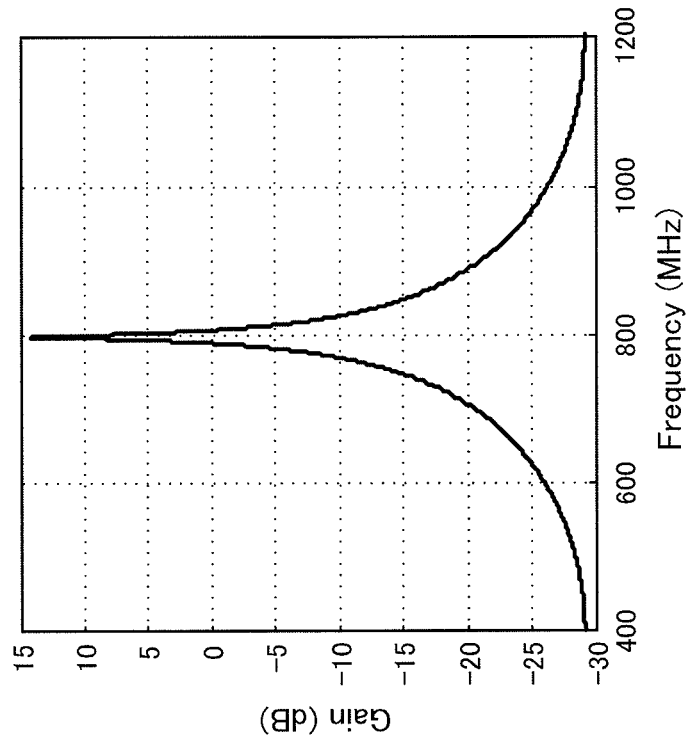
FIG. 22 is a characteristic diagram showing an example of filter characteristics realized according to Embodiment 2.
Figure 22A:
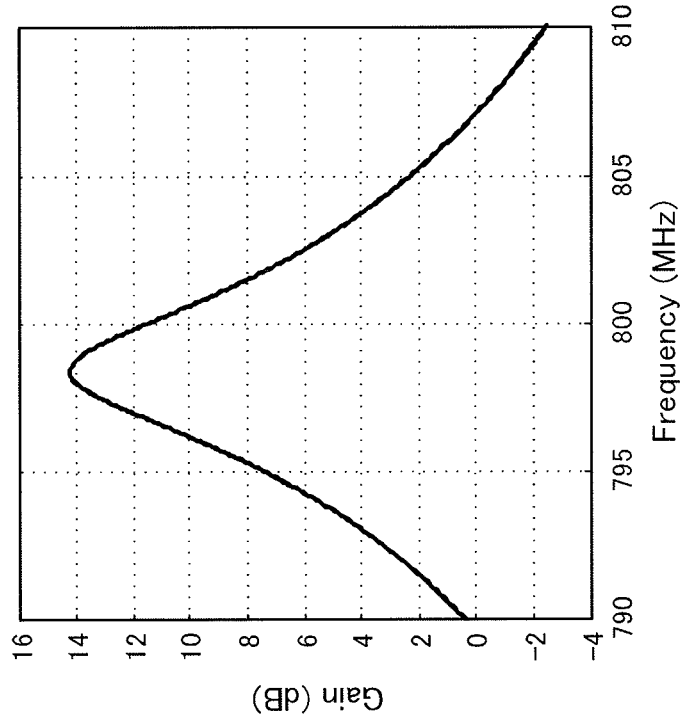

FIG. 22A and FIG. 22B show examples of frequency characteristics when $C_H$=40 pF, $C_R$=50 fF and $C_{Him}$=500 fF in equation 14 (here $f_{LO}$=800 MHz, and excluding IIR characteristics with $C_B$). As shown in equation 14, it is understood that it is possible to shift the frequency at which the gain is maximized, to the low frequency side by realizing a complex coefficient in the denominator of the transfer function. In this way, it is possible to realize complex transfer functions using a simple circuit configuration as shown in FIG. 18 and control signals (see FIG. 19), and thereby perform image rejection.

Figure 23:
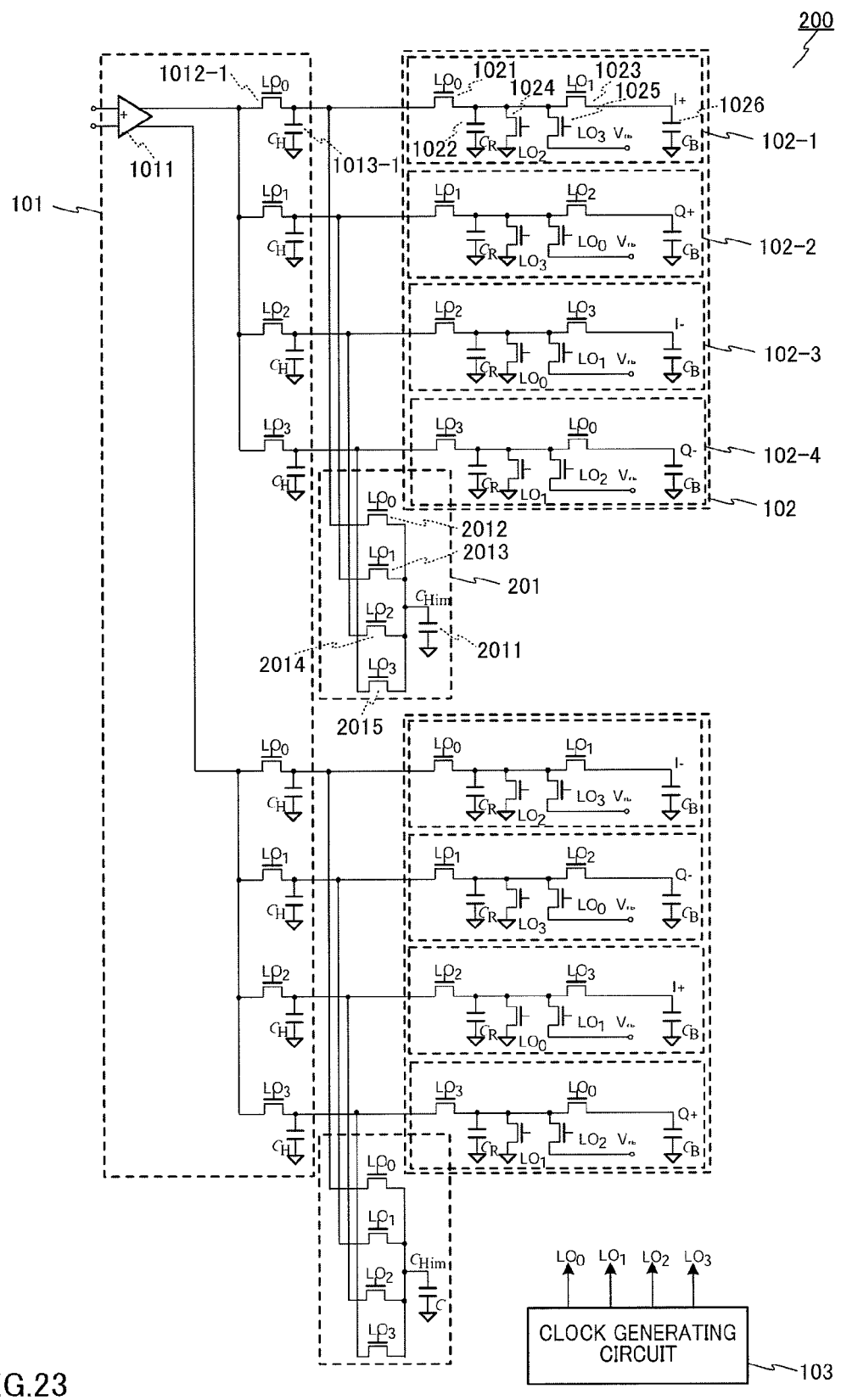
FIG. 23 is a connection diagram showing another configuration of the sampling circuit according to Embodiment 2.

Here, FIG. 23 shows another configuration of sampling circuit 200 shown in FIG. 18. FIG. 23 is different from FIG. 18 in that IQ coupling circuit 201 further includes charging switches 2012 to 2015, in addition to imaginary number capacitor 2011. Moreover, it is different in that clock generating circuit 103 supplies four-phase control signals having phases different from each other, to charging switches 2012 to 2015.

With a configuration as shown in FIG. 23, imaginary number capacitor 2011 is always connected to TA (transconductance amplifier) 1011 via charging switches 2012 to 2015, like in the configuration shown in FIG. 18. Therefore, connection between components during periods of time $T_0$ to $T_3$ is the same as in FIG. 21A to FIG. 21D.

Embodiment 3

Figure 24:
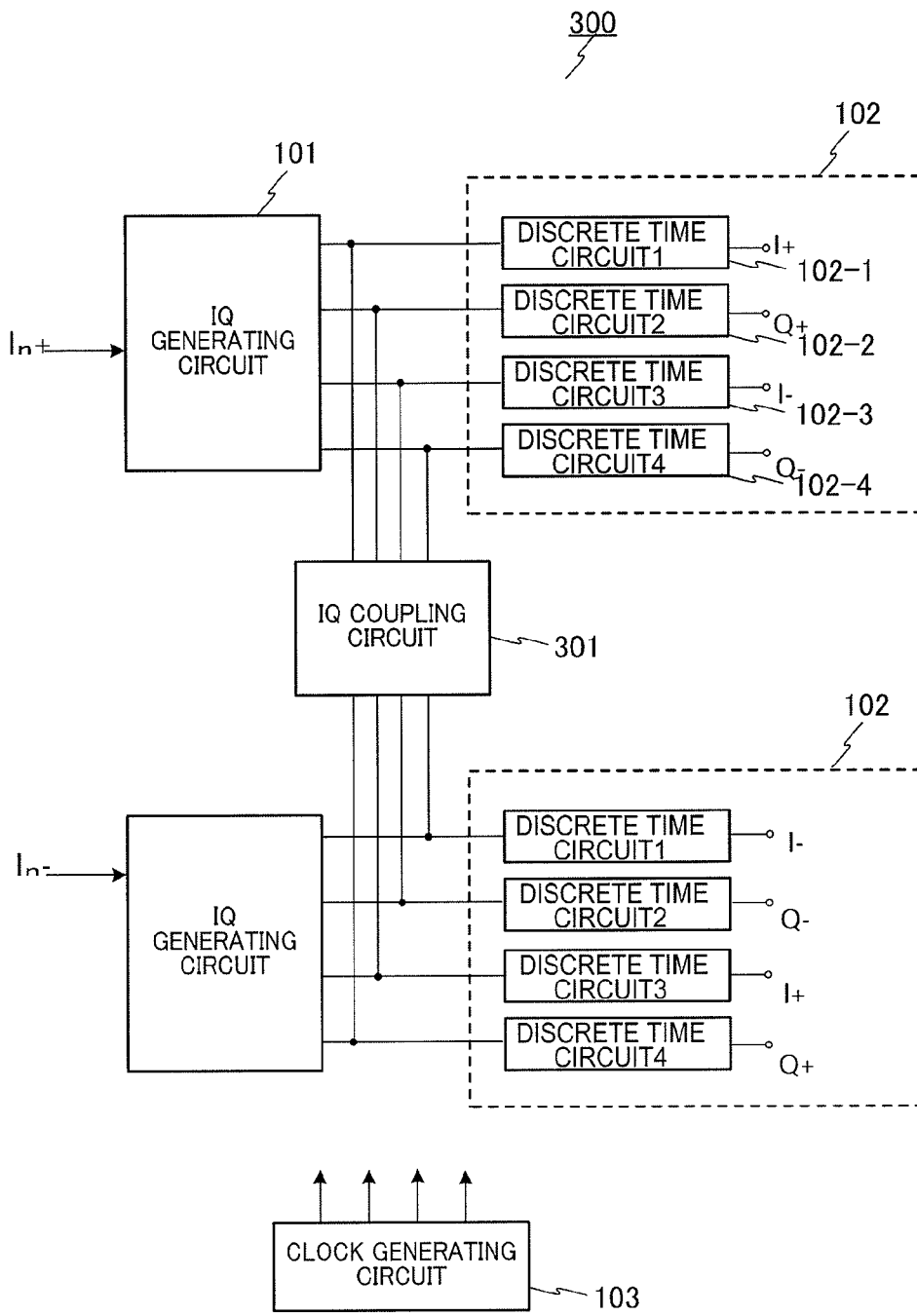
FIG. 24 is a block diagram showing a configuration of a sampling circuit according to Embodiment 3 of the present invention.

FIG. 24 shows a configuration of a sampling circuit according to the present embodiment. Here, sampling circuit 300 shown in FIG. 24 has a configuration based on the configuration of sampling circuit 200 shown in FIG. 17, where the same components as in FIG. 17 are assigned the same reference numerals and descriptions will be omitted.

Sampling circuit 300 shown in FIG. 24 is different from sampling circuit 200 shown in FIG. 17 in that IQ coupling circuit 301 is connected to both negative-phase and positive phase sample values. According to this configuration, it is possible to shift the frequency at which the gain of a frequency characteristic is maximized, to the high frequency side.

IQ coupling circuit 301 exchanges electrical charge between positive-phase sample values and negative-phase sample values to couple these four kinds of sample values, and therefore realize a negative complex coefficient in the denominator in a transfer function.

Figure 25:
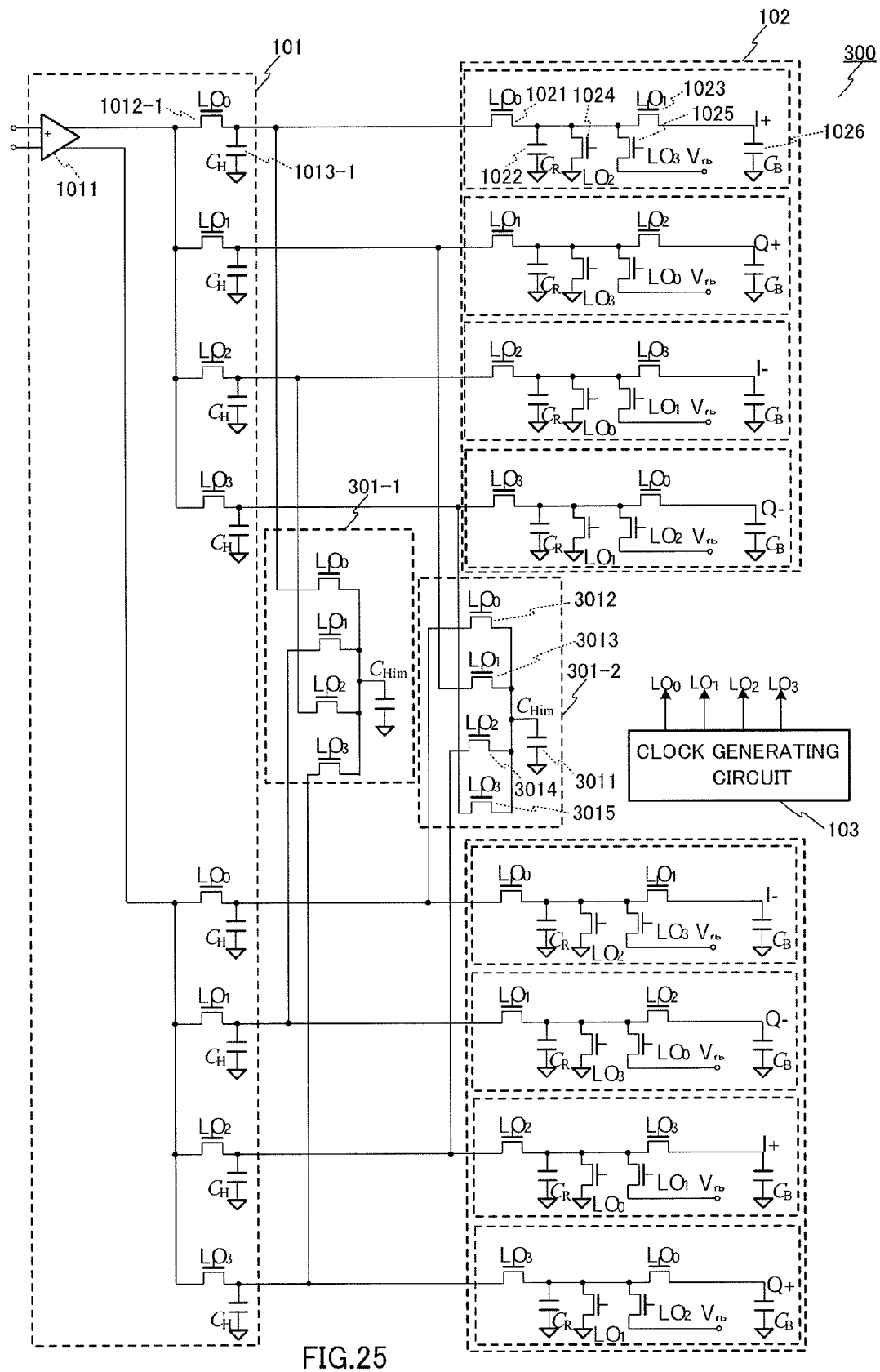
FIG. 25 is a connection diagram showing a configuration of the sampling circuit according to Embodiment 3.

FIG. 25 shows a more specific configuration of sampling circuit 200. Here, in FIG. 25, IQ coupling circuits 301-1 and 301-2 constitute IQ coupling circuit 301 shown in FIG. 24.

Each of IQ coupling circuits 301-1 and 302-2 has imaginary number capacitor 3011 and charging switches 3012 to 3015.

In IQ coupling circuit 301-1, imaginary number capacitor 3011 couples the electrical charge of the first and third kinds of positive-phase sampling values via charging switches 3012 and 3014, with the electrical charge of the second and fourth kinds of negative-phase sampling values via charging switches 3013 and 3015.

In IQ coupling circuit 301-2, imaginary number capacitor 3011 couples the electrical charge of the first and third kinds of negative-phase sampling values via charging switches 3012 and 3014, with the electrical charge of the second and fourth kinds of positive-phase sampling values via charging switches 3013 and 3015.

In this way, with the present embodiment, in IQ coupling circuit 301, the second and fourth kinds of positive-phase sampling values are connected to the second and fourth kinds of negative-phase sampling values. Meanwhile, in IQ coupling circuit 301, the second and fourth kind of negative-phase sampling values are connected to the second and fourth kinds of positive-phase sampling values.

It is possible to obtain the following transfer function by the same operation as in Embodiment 1 and Embodiment 2.

(Equation 15)

$$T = \frac{g_m T_{LO}}{\pi\sqrt{2}} \cdot \frac{1}{C_R + C_H + C_{Him} - jz^{-1}C_{Him} - z^{-1}C_H} \cdot \frac{C_R}{C_R + C_B - z^{-1}C_B} \quad [15]$$

As seen from equation 15, with the present embodiment, it is possible to realize a negative complex coefficient in the denominator in a transfer function.

Figure 26B:
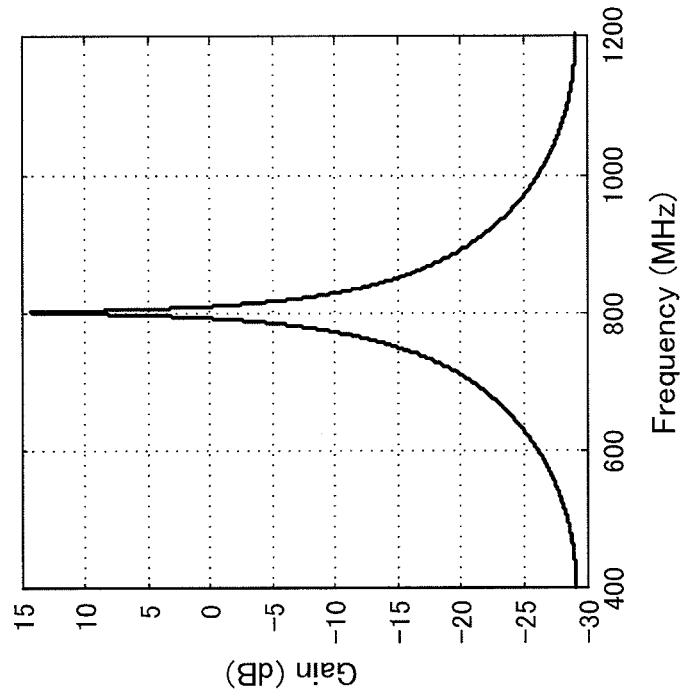
FIG. 26 is a characteristic diagram showing an example of filter characteristics realized according to Embodiment 3.
Figure 26A:
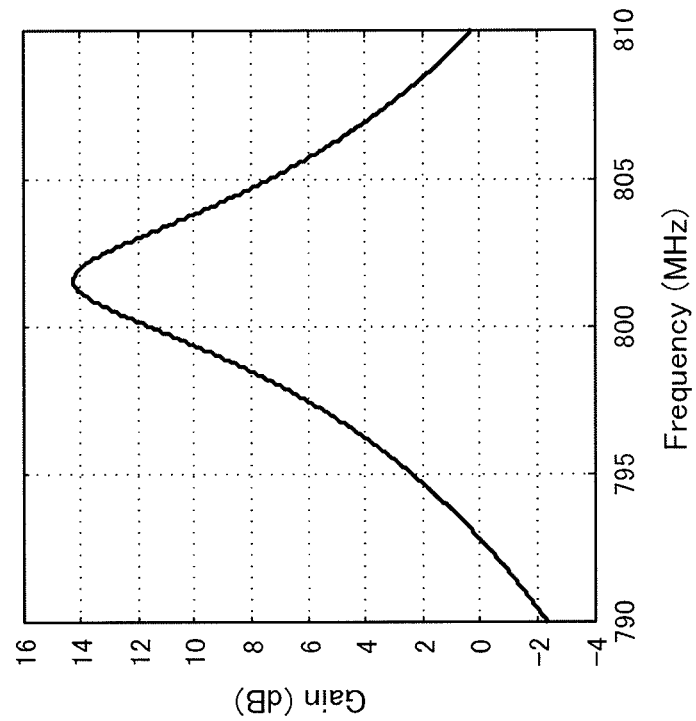

FIG. 26A and FIG. 26B show frequency characteristics when $C_H$=40 pF, $C_R$=50 fF, $C_{Him}$=500 fF in equation 15 (here $f_{LO}$=800 MHz, and excluding IIR characteristics with $C_B$). As shown in FIG. 26A, it is understood that it is possible to shift the frequency at which the gain of the frequency characteristic is maximized, to the high frequency side. In this way, it is possible to realize complex transfer functions with a simple circuit configuration and control (reference) signals, and thereby perform image rejection. Moreover, with the present embodiment, it is possible to freely shift the frequency at which the gain is maximized, to the low frequency side or high frequency side, so that the design flexibility is significantly improved.

Embodiment 4

Figure 27:
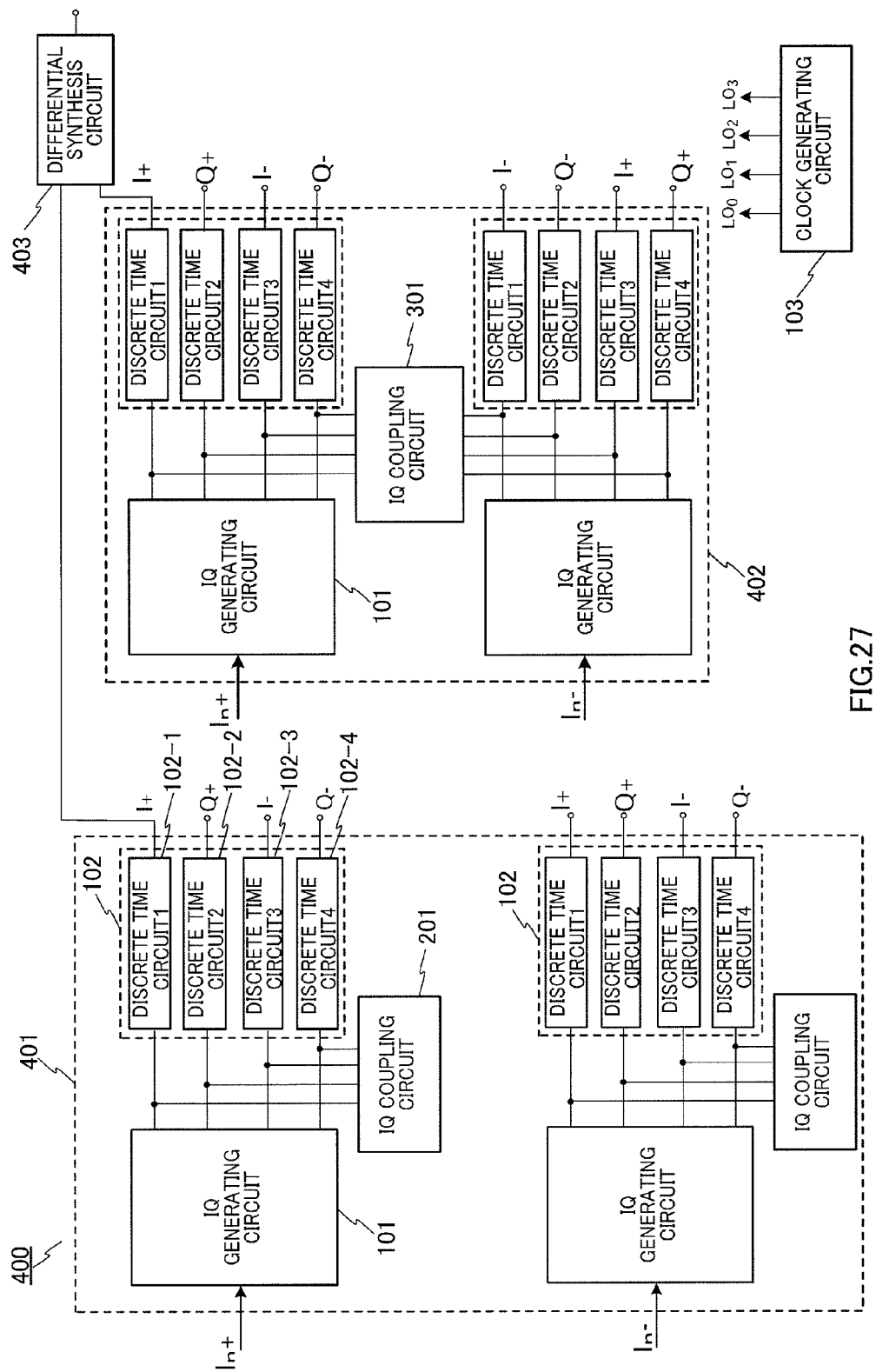
FIG. 27 is a block diagram showing a configuration of a sampling circuit according to Embodiment 4 of the present invention.

FIG. 27 shows a configuration of a sampling circuit according to the present embodiment. In sampling circuit 400 shown in FIG. 27, differential synthesis circuit, as output section 403, is connected to the output side of sampling circuit 401 matching Embodiment 2 and the output side of sampling circuit 402 matching Embodiment 3. Then, a configuration is adopted in which output section 403 outputs the difference between an I+ output from sampling circuit 401 and an I+ output from sampling circuit 402.

Here, FIG. 27 shows a configuration in which only respective I+ outputs from sampling circuits 401 and 402 are connected to output section (differential synthesis circuit) 403. Here, respective I−, Q+ and Q− outputs from sampling circuits 401 and 402 are connected to output section (differential synthesis circuit) 403, so that it is possible to obtain the same characteristic as in a case of I+ outputs.

Figure 28:
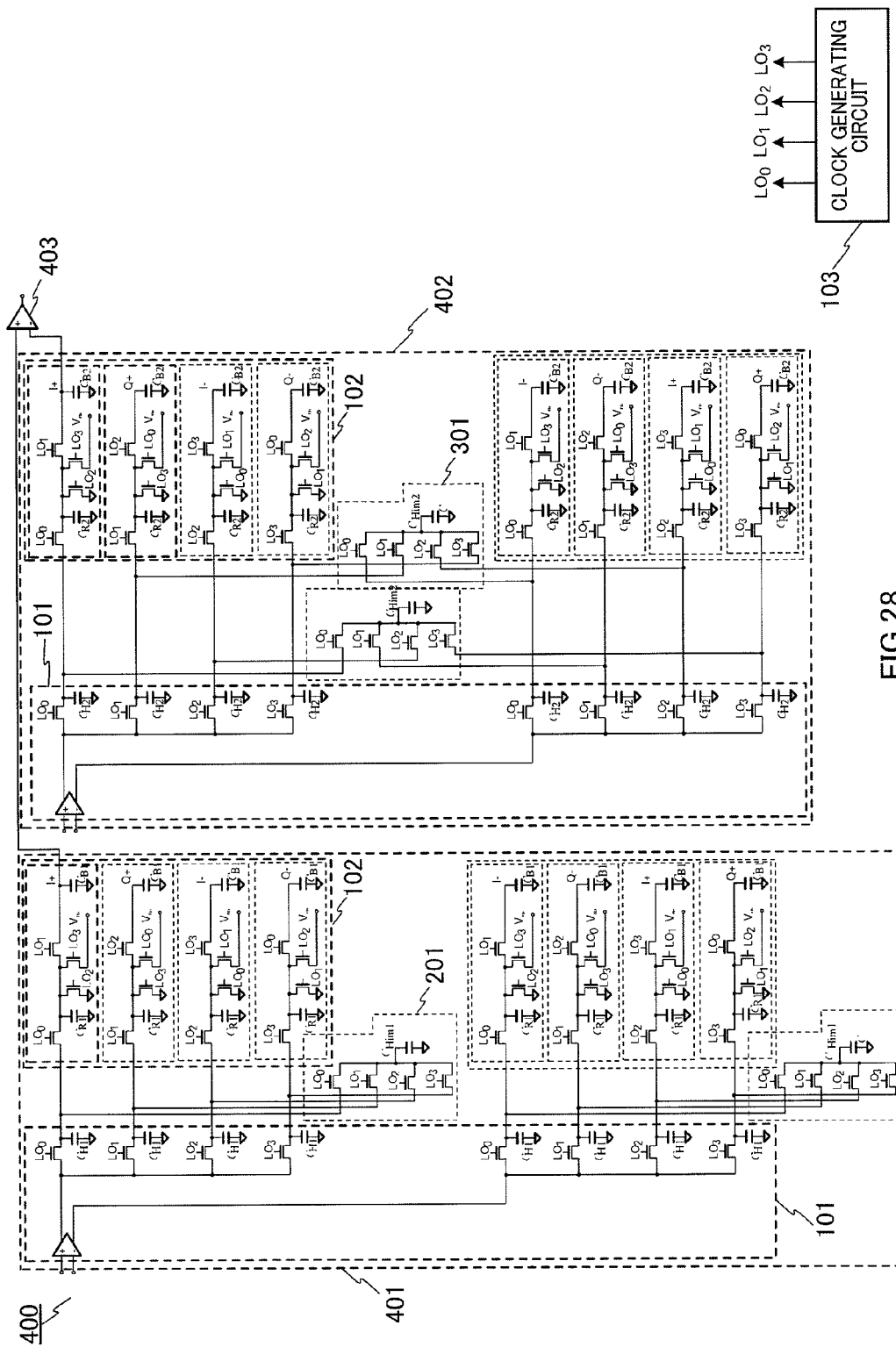
FIG. 28 is a connection diagram showing a configuration of the sampling circuit according to Embodiment 4.

FIG. 28 shows the configuration shown in FIG. 27 in detail. In FIG. 28, sampling circuit 401 corresponds to sampling circuit 200 shown in FIG. 23, and sampling circuit 402 corresponds to sampling circuit 300 shown in FIG. 25.

Output section 403 outputs the difference between an I+ output from sampling circuit 401 and an I+ output from sampling circuit 402. In other words, output section 403 outputs the difference between an output from sampling circuit 401 and an output having the same phase as the output from sampling circuit 401, among outputs from sampling circuit 402.

Sampling circuit 401 and sampling circuit 402 operate like in Embodiment 2 and Embodiment 3, so that it is possible to realize the transfer function represented by the following equation.

(Equation 16)

$$T = \frac{g_m T_{LO}}{\pi\sqrt{2}} \cdot \left( \frac{1}{C_{R1} + C_{H1} + C_{Him1} + jz^{-1}C_{Him1} - z^{-1}C_{H1}} - \frac{1}{C_{R2} + C_{H2} + C_{Him2} - jz^{-1}C_{Him2} - z^{-1}C_{H2}} \right) \cdot \frac{C_R}{C_R + C_B - z^{-1}C_B} \quad [16]$$

With the present embodiment, by reducing the sum of first-order IIR coefficients to a common denominator in equation 16, it is possible to create a polynomial equation in the numerator in the transfer function. That is, with the present embodiment, it is possible to set zero in the numerator in a transfer function, so that it is possible to attenuate signals having a specific frequency.

In this way, the values of the history capacitor, the rotate capacitor and the imaginary number capacitor in each of sampling circuit 401 and sampling circuit 402 are set to appropriate values, so that it is possible to generate attenuation poles in frequency characteristics. Here, sampling circuit 401 matches Embodiment 2, and sampling circuit 402 matches Embodiment 3.

Figure 29A:
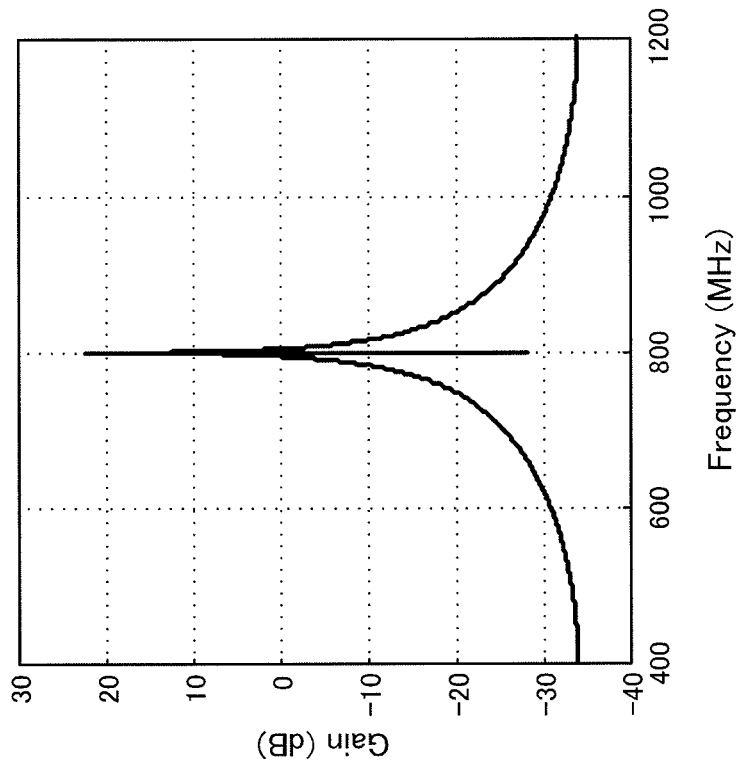
FIG. 29 is a characteristic diagram showing an example of filter characteristics realized according to Embodiment 4.
Figure 29B:
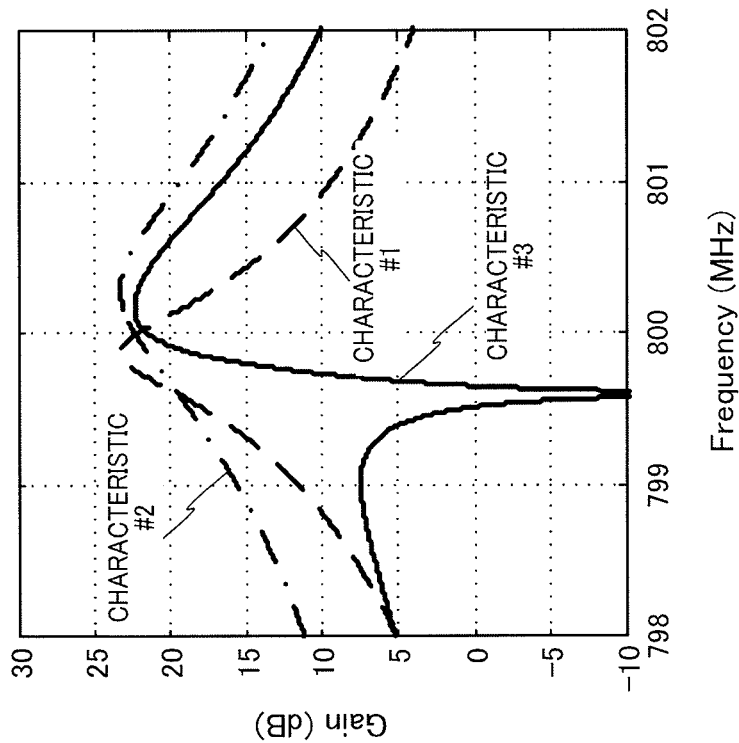

FIG. 29A and FIG. 29B show the results of calculation of frequency characteristics when $C_{H1}$=84.0 pF, $C_{H2}$=210 pF, $C_{R1}$=188 fF, $C_{R2}$=187 fF, and $C_{Him1}$=$C_{Him2}$=198 fF (here $f_{LO}$=800 MHz, and excluding IIR characteristics with $C_B$). FIG. 29B shows a wideband frequency characteristic, and FIG. 29A shows narrowband frequency characteristics around the passband (800 MHz) in the frequency characteristic shown in FIG. 29B. In FIG. 29A, characteristic #1 of sampling circuit 401 and characteristic #2 of sampling circuit 402 are each obtained by shifting the frequency at which the gain is maximized. Here, characteristic #3, which is the difference between characteristic #1 and characteristic #2, is the frequency characteristic of sampling circuit 400 according to the present embodiment. As seen from FIG. 29A, with the present embodiment, it is possible to realize an attenuation pole in one side of the frequency characteristic.

As described above, according to the present embodiment, output section 403 outputs the difference between an output from sampling circuit 401 and an output having the same phase as the output from sampling circuit 401, among outputs from sampling circuit 402. By this means, according to the present embodiment, it is possible to realize an attenuation pole in one side of the frequency characteristic to achieve excellent image rejection characteristics (a high image rejection ratio).

When the present embodiment is applied to a one segment receiver (having a desired frequency band of 250 kHz to 680 kHz and an image band of −680 kHz to −250 kHz), it is possible to increase the image rejection ratio, which is the maximum 6.60 dB with a conventional configuration, to 18.6 dB.

Embodiment 5

Figure 30:
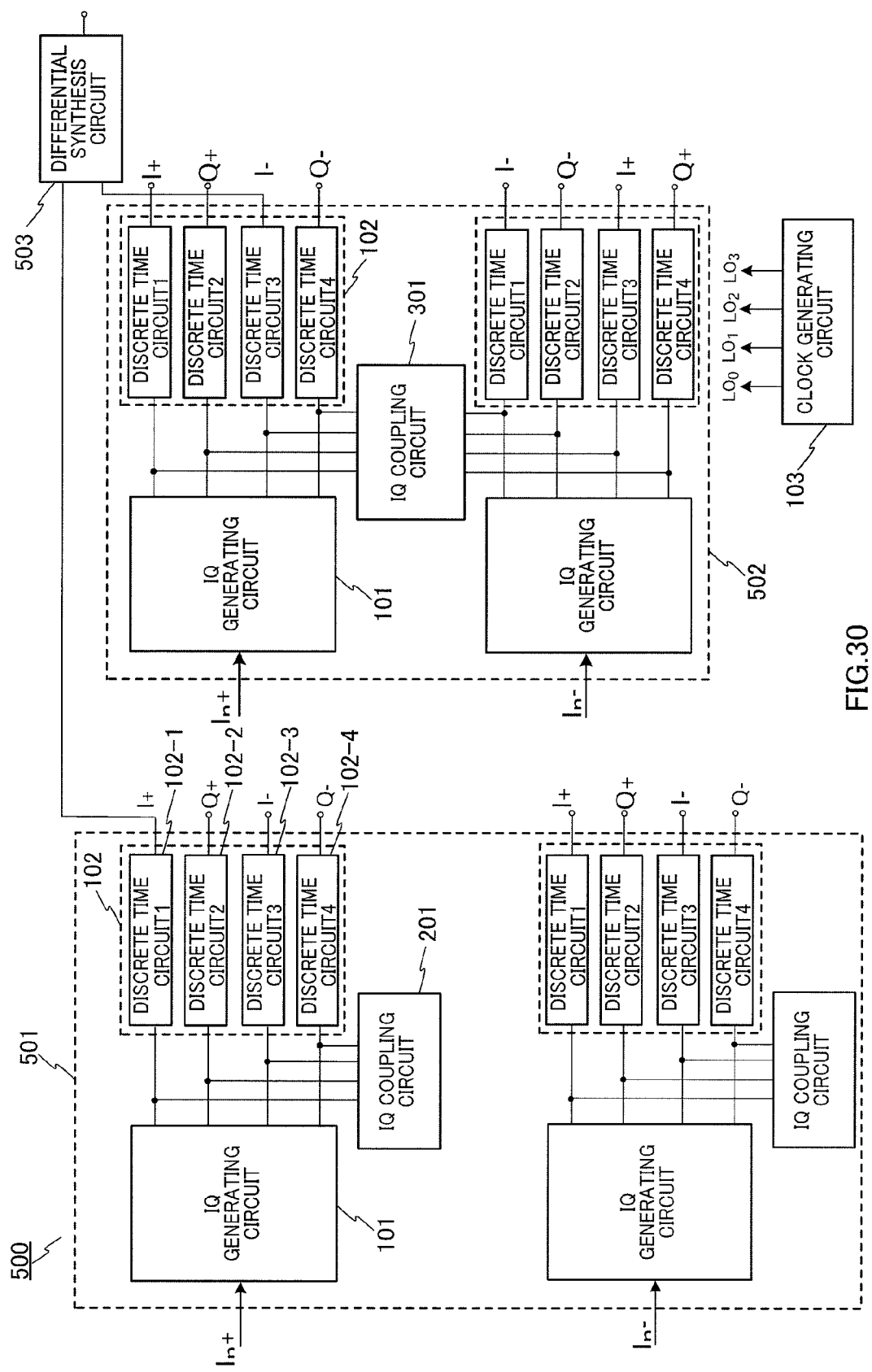
FIG. 30 is a block diagram showing a configuration of a sampling circuit according to Embodiment 5 of the present invention.

FIG. 30 shows a configuration of a sampling circuit according to the present embodiment. In sampling circuit 500 shown in FIG. 30, an output of sampling circuit 501 matching Embodiment 2 and an output of sampling circuit 502 matching Embodiment 3 are connected to a synthesis circuit as output section 503. In addition, with the present embodiment, a configuration is adopted in which output section 503 outputs the sum of an I+ output from sampling circuit 501 and an I− output from sampling circuit 502.

Here, FIG. 30 shows a configuration in which only an I+ output and an I− output are connected to output section (synthesis circuit) 503. Here, a pair of an I− output and an I+ output, a pair of a Q+ output and a Q− output, and a pair of a Q− output and a Q+ output are also connected to output section (synthesis circuit) 503, so that it is possible to obtain the same characteristic as in the case in which a pair of an I+ output and an I− output are connected to output section 503.

Figure 31:
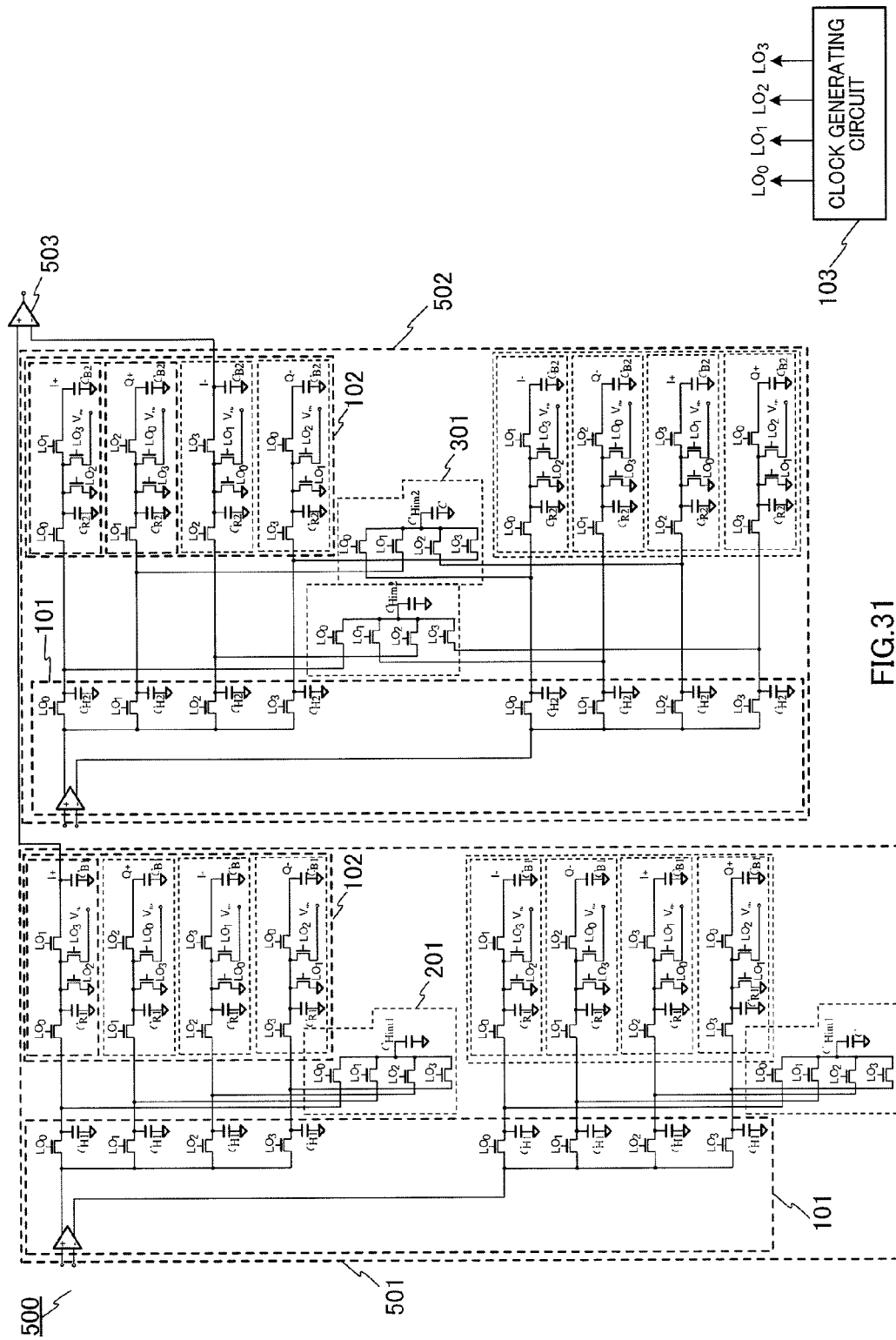
FIG. 31 is a connection diagram showing a configuration of the sampling circuit according to Embodiment 5.

FIG. 31 shows the configuration shown in FIG. 30 in detail. In FIG. 31, sampling circuit 501 corresponds to sampling circuit 200 shown in FIG. 23, and sampling circuit 502 corresponds to sampling circuit 300 shown in FIG. 25.

Output section 503 outputs the sum of an I+ output from sampling circuit 501 and an I− output from sampling circuit 502. In other words, output section 503 outputs the sum of an output from sampling circuit 501 and an output having the opposite phase to the output from sampling circuit 501, among outputs from sampling circuit 502.

Sampling circuit 501 and sampling circuit 502 operate like in Embodiment 2 and Embodiment 3, so that it is possible to realize the transfer function represented by the following equation.

(Equation 17)

$$T = \frac{g_m T_{LO}}{\pi\sqrt{2}} \cdot \left( \frac{1}{C_{R1}+C_{H1}+C_{Him1}+jz^{-1}C_{Him1}-z^{-1}C_{H1}} + \frac{1}{C_{R2}+C_{H2}+C_{Him2}-jz^{-1}C_{Him2}-z^{-1}C_{H2}} \right) \cdot \frac{C_R}{C_R+C_B-z^{-1}C_B}$$ [17]

The values of the history capacitor, the rotate capacitor and the imaginary number capacitor in each of sampling circuit 501 and sampling circuit 502 are set to appropriate values, so that it is possible to obtain wideband frequency characteristics. Here, sampling circuit 501 matches Embodiment 2, and sampling circuit 502 matches Embodiment 3.

Figure 32B:
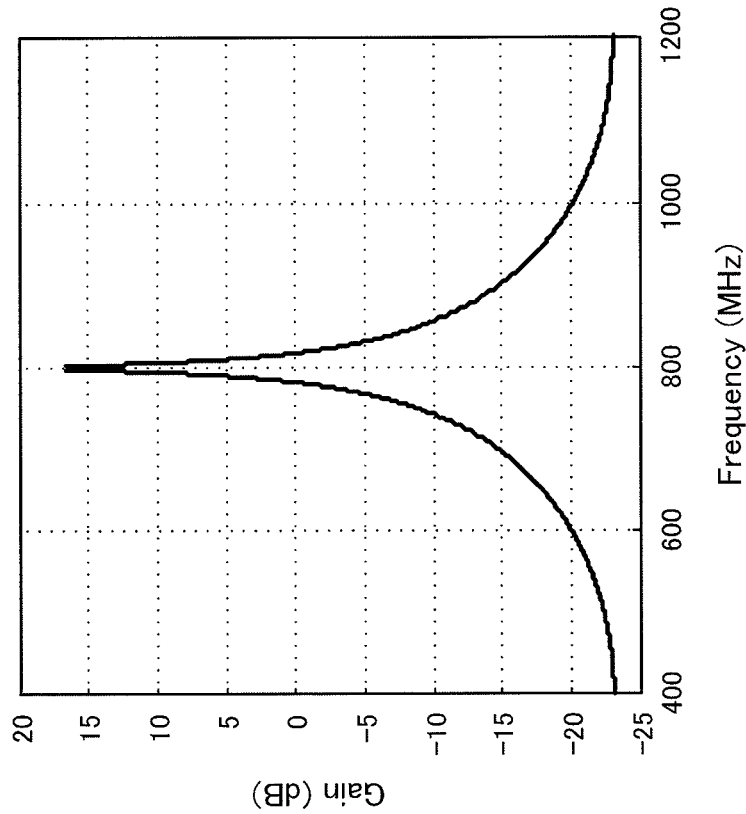
FIG. 32 is a characteristic diagram showing an example of filter characteristics realized according to Embodiment 5.
Figure 32A:
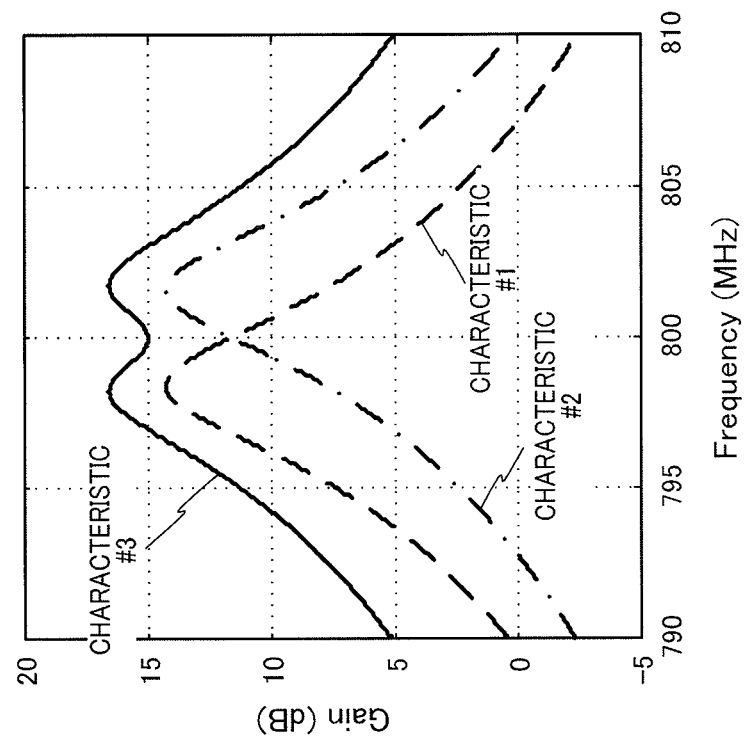

FIG. 32A and FIG. 32B show the results of calculation of frequency characteristics when $C_{H1}$=$C_{H2}$=40 pF, $C_{R1}$=$C_{R2}$=50 fF and $C_{Him1}$=$C_{Him2}$=500 fF (here $f_{LO}$=800 MHz, and excluding IIR characteristics with $C_B$). FIG. 32B shows a wideband frequency characteristic, and FIG. 32A shows narrowband frequency characteristics around the passband (800 MHz) in the frequency characteristic shown in FIG. 32B. In FIG. 32A, characteristic #1 and characteristic #2 are each obtained by shifting the frequency at which the gain is maximized. Here, characteristic #3, which is the sum of characteristic #1 and characteristic #2, is the frequency characteristic of sampling circuit 400 according to the present embodiment. As seen from FIG. 32A, sampling circuit 400 according to the present embodiment can realize pseudo-Chebyshev characteristics including ripple in the passband. Here, it is possible to flat the passband depending on setting of each circuit element value.

As described above, sampling circuit 500 according to the present embodiment outputs the sum of an output from sampling circuit 501 and an output having the opposite phase to the output from sampling circuit 501, among outputs from sampling circuit 502. By this means, it is possible to provide wideband frequency characteristics.

Figure 33:
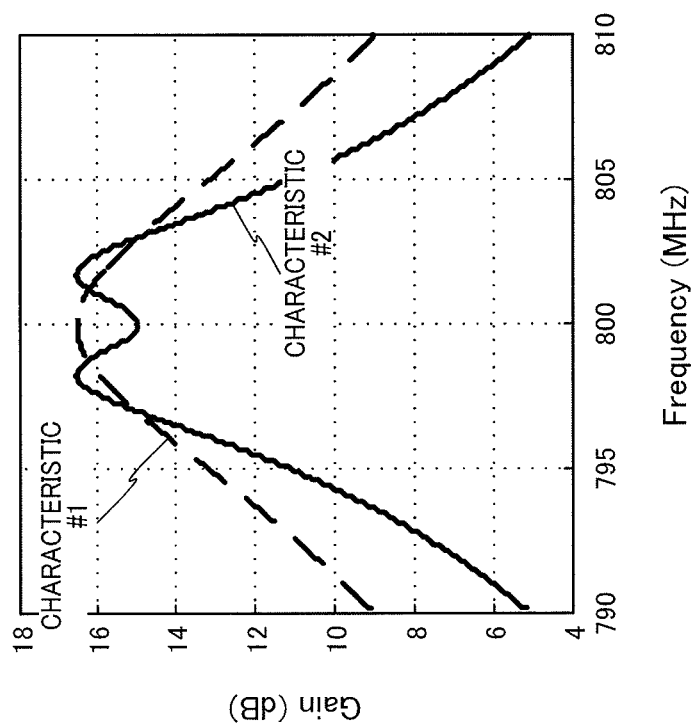
FIG. 33 is a characteristic diagram showing comparison between a filter characteristic realized with Embodiment 5 and a filter characteristic realized with the conventional configuration.

FIG. 33 shows comparison of frequency characteristics between the conventional configuration (see Non-Patent Literature 1) and a proposed configuration in a case in which the present invention is applied to a full segment receiver for digital television (having a desired frequency band of 0 to 3 MHz and an interfering wave band of 3 MHz to 9 MHz). Here, the frequency characteristic with the conventional configuration is characteristic #1 in FIG. 33 and the frequency characteristic with the proposed configuration is characteristic #2 in FIG. 33. Conventionally, as a result of comparison with the same in-band deviation in the passband, only a DU ratio (desired to undesired signal ratio:only signal power ratio between a desired waveband and an interfering waveband) of 2.28 dB can be obtained between neighboring wavebands. By contrast with this, with the present embodiment, it is possible to obtain a DU ratio of 5.56 dB, and it is understood that it is possible to achieve excellent neighboring interfering wave cancellation characteristics. By this means, it is possible to simplify the configuration of a baseband filter by a DU ratio, and it is possible to reduce the size of the chip area and cost.

Embodiment 6

With the present embodiment, a scheme of reducing the circuit scale of a LOW-IF (intermediate frequency) receiver by applying the complex sampling circuit described with Embodiments 2 to 5, will be explained.

Figure 34A:
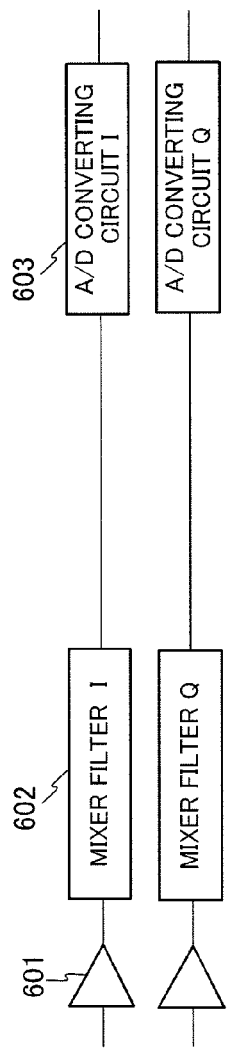
FIG. 34 is a block diagram showing a configuration of a receiver according to Embodiment 6 of the present invention.

FIG. 34A is a block diagram showing a configuration of a LOW-IF receiver that performs image rejection by digital processing. With this configuration, one amplifier 601, one mixer filter 602 and one A/D converting circuit 603 are required for each of I and Q, so that the circuit scale will increase.

Figure 34B:
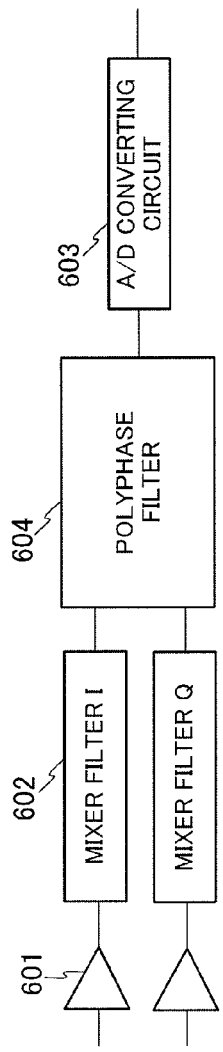

FIG. 34B is a block diagram showing a configuration of a LOW-IF receiver that performs image rejection by analog polyphase filter 604. With the configuration shown in FIG. 34B, image rejection by digital processing is not performed, so that only one A/D converting circuit 603 is required, and therefore it is possible to reduce the circuit scale.

Figure 34C:
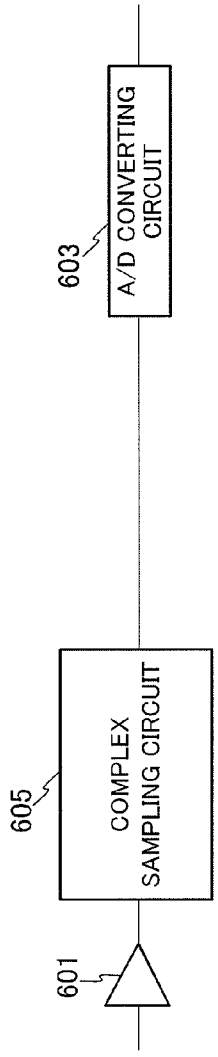

FIG. 34C is a block diagram showing a configuration of a LOW-IF receiver that performs image rejection using complex sampling circuit 605.

Complex sampling circuit 605 allows complex filter processing using signals received from one input, and image frequency signals are removed from the output of complex sampling circuit 605. Therefore, no more than one analog converting circuit is required. That is, as compared to the configuration shown in FIG. 34A, it is possible to remove one amplifier 601 and one A/D converting circuit 603 by replacing two mixer filter 602 with complex sampling circuit 605. In addition, as compared to the configuration shown in FIG. 34B, it is possible to remove one amplifier 601 to eliminate use of polyphase filter 604, so that it is possible to reduce the circuit scale.

With a diversity reception configuration according to the present embodiment, maximum ratio combining is realized by preparing a plurality of the same receivers. Therefore, it is possible to reduce the circuit scale of a receiver by using a complex sampling circuit. Here, in the diversity reception scheme, a plurality of receivers do not necessarily need to have the same configuration, and a configuration is possible where a main system is formed to produce the maximum performance and a plurality of receiving systems including simple complex sampling circuits are provided. By reducing the circuit scale, it is possible to produce a great effect of reducing not only the area but also power consumption.

Although the cases have been explained where various switches are n-type FETs, this is by no means limiting. For example, various switches may be p-type FETs, or combination of an n-type FET and a p-type FET is possible. In this case, a source terminal and a drain terminal may be exchanged.

The disclosure of Japanese Patent Application No. 2009-200816, filed on Aug. 31, 2009, including the specification, drawings and abstract, is incorporated herein by reference in its entirety.

INDUSTRIAL APPLICABILITY

The sampling circuit and the receiver according to the present invention are useful for a high-frequency signal processing circuit in the receiving section in a radio communication apparatus, and are appropriate for signal frequency conversion and filtering processing.

REFERENCE SIGNS LIST

10 Sampling receiver
13, 100, 200, 300, 400, 401, 402, 500, 501, 502 Sampling circuit
101 IQ generating circuit
1011 Transconductance amplifier
1012-1 to 1012-4 Sampling switch
1013-1 to 1013-4 History capacitor
102 Discrete time circuit group
102-1 to 102-4 Discrete time circuit
1021, 2012 to 2015, 3012 to 3015 Charging switch
1022 Rotate capacitor
1023 Dump switch
1024 Reset switch
1025 Precharge switch
1026 Buffer capacitor
103 Clock generating circuit
201, 301, 301-1, 301-2 IQ coupling circuit
2011, 3011 Imaginary number capacitor
403, 503 Output section (differential synthesis circuit)
601 Amplifier
602 Mixer filter
603 A/D converting circuit
604 Polyphase filter
605 Complex sampling circuit

The invention claimed is:

1. A sampling circuit, comprising:
a clock generating circuit that outputs four-phase control signals according with a period of a carrier frequency of an input signal;
an IQ generating circuit that samples the input signal according to the four-phase control signals, and accumulates four kinds of sample values having different phases as electrical charge; and
a group of discrete time circuits including a first to a fourth discrete time circuits that share electrical charge of the four kinds of sample values, respectively, wherein:
each of the first to the fourth discrete time circuits includes:
a charging switch;
a rotate capacitor connected to the IQ generating circuit via the charging switch;
a dump switch; and
a buffer capacitor connected to the rotate capacitor via the dump switch;
the charging switch is controlled on and off using any one of the four-phase control signals;
the rotate capacitor shares electrical charge accumulated in the IQ generating circuit via the charging switch;
the dump switch is controlled on and off using another one of the four-phase control signals having a different phase from the four-phase control signal used by the charging switch; and
the buffer capacitor forms an output value by sharing electrical charge with the rotate capacitor via the dump switch.

2. The sampling circuit according to claim 1, further comprising:
a coupling circuit that couples electrical charge of the four kinds of sample values having different phases,
wherein, during a period the charging switch is turned on, the rotate capacitor shares electrical charge accumulated in the IQ generating circuit and electrical charge coupled by the coupling circuit.

3. The sampling circuit according to claim 2, wherein:
the IQ generating circuit includes:
a first IQ generating circuit that accumulates four types of positive-phase sample values having different phases as electrical charge by sampling a positive-phase input signal; and
a second IQ generating circuit that accumulates four types of negative-phase sample values having different phases as electrical charge by sampling a negative-phase input signal;

the coupling circuit includes:
- a first coupling circuit that couples electrical charge of a first, a second, a third and a fourth types of the positive-phase sample values; and
- a second coupling circuit that couples electrical charge of a first, a second, a third and a fourth types of the negative-phase sample values; and the group of discrete time circuits includes:
- a first group of discrete time circuits connected to the first IQ generating circuit; and
- a second group of discrete time circuits connected to the second IQ generating circuit.

4. The sampling circuit according to claim 2, wherein:
the IQ generating circuit includes:
- a first IQ generating circuit that accumulates four types of positive-phase sample values having different phases, as electrical charge, by sampling a positive-phase input signal; and
- a second IQ generating circuit that accumulates four types of negative-phase sample values having different phases, as electrical charge, by sampling a negative-phase input signal;

the coupling circuit includes:
- a first coupling circuit that couples electrical charge of a first and a third types of positive-phase sample values with electrical charge of a second and a fourth types of negative-phase sample values; and
- a second coupling circuit that couples electrical charge of a second and a fourth types of positive-phase sample values with electrical charge of a first and a third types of negative-phase sample values; and the group of discrete time circuit includes:
- a first group of discrete time circuits connected to the first IQ generating circuit; and
- a second group of discrete time circuits connected to the second IQ generating circuit.

5. The sampling circuit according to claim 2, wherein:
the coupling circuit includes:
- one capacitor; and
- four switches that control to turn on and off a current of the four kinds of sample values having different phases, to the capacitor;

wherein the clock generating circuit generates, as the control signals, four-phase signals which have a duty ratio of 25% and have phases ¼ shifted from each other, and outputs the control signals which are high at different timings, to the four switches, respectively.

6. The sampling circuit according to claim 2, wherein the coupling circuit has one capacitor and is connected between the transconductance amplifier and the sampling switch.

7. The sampling circuit according to claim 1, wherein:
the IQ generating circuit includes:
a transconductance amplifier that converts the input signal from a voltage signal to a current signal and outputs the current signal;
four sampling switches that sample the current signal according to the four-phase control signals, and output four kinds of current signals; and
four history capacitors that accumulate four kinds of electrical charge supplied by sampled current signals, each of the first to the fourth discrete time circuits further includes:

a reset switch that controls to accumulate or discharge electrical charge in the rotate capacitor; and
a precharge switch that controls a voltage of the rotate capacitor,
wherein the charging switch, the dump switch, the reset switch and the precharge switch are controlled on and off in this order, using the four-phase control signals.

8. The sampling circuit according to claim 7,
wherein each of the four sampling switches samples the current signal according to a designated four-phase control signal corresponding to one and only one of the four sampling switches.

9. The sampling circuit according to claim 7,
wherein each of the four sampling switches connects to a charging switch included in a corresponding discrete time circuit, and the each of the four sampling switches and the charging switch included in the corresponding discrete time circuit are controlled using one of the four-phase control signals.

10. The sampling circuit according to claim 1,
wherein the clock generating circuit generates, as the control signals, four-phase signals which have a same period as a period of a carrier frequency of the input signal, have a duty ratio of 25%, have phases a ¼ period shifted from each other, and outputs the control signals which are high at different timings, to four sampling switches, respectively.

11. The sampling circuit according to claim 1, wherein:
each of the switches has a set of two sub-switches serially connected; and
the clock generating circuit:
generates, as the control signals, two-phase first and second signals which have a same period as a period of a carrier frequency of the input signal, have a duty ratio of 50% and have phases a ½ period shifted from one another, and two-phase third and fourth signals which have a period ½ of the period of the carrier frequency of the input signal, have a duty ratio of 50% and have phases shifted from the carrier frequency by a ¼ period; and
outputs the first or second signal to one of the two sub-switches serially connected, and outputs the third or fourth signal to the other.

12. A receiver, comprising:
a sampling circuit according to claim 1;
an antenna that receives an input signal;
a low noise amplifier that amplifies a signal received by the antenna and outputs an amplified signal to the sampling circuit; and
an analog-to-digital converting section that converts an output signal from the sampling circuit, from an analog signal to a digital signal.

13. The receiver according to claim 12, wherein:
the receiver is a low-intermediate frequency receiver; and
the sampling circuit outputs a signal in a low-intermediate frequency band, as the output signal.

14. A diversity receiver, comprising:
a plurality of receivers; and
a digital processing section that selectively synthesizes digital outputs from the plurality of receivers, wherein at least one of the plurality of receivers includes the receiver according to claim 13.

* * * * *